United States Patent
Wu et al.

(10) Patent No.: US 7,219,045 B1
(45) Date of Patent: May 15, 2007

(54) HOT-CARRIER RELIABILITY DESIGN RULE CHECKER

(75) Inventors: Lifeng Wu, San Jose, CA (US); Jeong Y. Choi, Portland, OR (US); Alvin I. Chen, San Jose, CA (US); Jingkun Fang, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 810 days.

(21) Appl. No.: 09/969,186

(22) Filed: Sep. 27, 2001

Related U.S. Application Data

(63) Continuation-in-part of application No. 09/832,933, filed on Apr. 11, 2001.

(60) Provisional application No. 60/236,865, filed on Sep. 29, 2000, provisional application No. 60/236,587, filed on Sep. 29, 2000, provisional application No. 60/236,586, filed on Sep. 29, 2000.

(51) Int. Cl.
*G06F 17/50* (2006.01)
*G06F 9/45* (2006.01)

(52) U.S. Cl. .............. 703/14; 716/4; 716/12

(58) Field of Classification Search .......... 703/13, 703/14, 27, 2, 121; 716/4; 326/117, 120, 326/124; 715/530
See application file for complete search history.

(56) References Cited

U.S. PATENT DOCUMENTS

| | | | |
|---|---|---|---|
| 5,533,197 A | 7/1996 | Moran et al. | |
| 5,600,578 A * | 2/1997 | Fang et al. | 703/14 |
| 5,600,844 A * | 2/1997 | Shaw et al. | 715/500 |
| 5,606,518 A | 2/1997 | Fang et al. | |
| 5,615,377 A * | 3/1997 | Shimizu et al. | 703/13 |
| 5,634,001 A | 5/1997 | Mittl et al. | |
| 5,880,967 A * | 3/1999 | Jyu et al. | 716/6 |
| 5,974,247 A | 10/1999 | Yonezawa | |
| 6,024,478 A | 2/2000 | Yamamoto | |
| 6,047,247 A | 4/2000 | Iwanishi et al. | |
| 6,278,964 B1 * | 8/2001 | Fang et al. | 703/19 |
| 6,414,498 B2 | 7/2002 | Chen | |
| 6,498,515 B2 | 12/2002 | Kawakami et al. | |
| 6,530,064 B1 * | 3/2003 | Vasanth et al. | 716/4 |
| 6,532,582 B1 * | 3/2003 | Zolotykh et al. | 716/11 |

(Continued)

OTHER PUBLICATIONS

IsSpice 4 User's Guide, Intusoft, pp. 196-216, 1988-1996.*

(Continued)

*Primary Examiner*—Anthony Knight
*Assistant Examiner*—Tom Stevens
(74) *Attorney, Agent, or Firm*—Parsons Hsue & de Runtz LLP

(57) ABSTRACT

The present invention is directed to methods for reliability simulations in aged circuits whose operation has been degraded through hot-carrier or other effects by allowing design rules on degradation to be included in the netlist. Once the hot-carrier circuit simulation is launched, the rules are checked and the reliability design rule violations are reported. The process can be performed on either the layout or schematic window. The design rule criteria can be any device parameter and can be expressed in absolute or relative terms. The criteria can be based on device type, model card name, instance geometry, or temperature. Additionally, values can be set prior to beginning the simulation.

73 Claims, 12 Drawing Sheets

U.S. PATENT DOCUMENTS 6,795,802 B2 *   9/2004   Yonezawa et al. ............ 703/19
2003/0158713 A1 *   8/2003   Akimoto et al. ............... 703/2

OTHER PUBLICATIONS

Kawakami et al, "Gate-level aged timing simulation methodology for hot-carrier reliability assurance", Proceedings of the ASP-DAC 2000. Asia and South Pacific, Jan. 25-28, 2000, pp. 289-294.*

Ye et al, "Developing aged SPICE model for hot carrier reliability simulation", Integrated Reliability Workshop Final Report, 2000 IEEE International, Oct. 23-26, 2000, pp. 153-154.*

Li et al, "A probabilistic timing approach to hot-carrier effect estimation", Computer-Aided Design of Integrated Circuits and Systems, IEEE Transactions on, vol. 13, Issue:10, Oct. 1994, pp. 1223-1234.*

Wu et al., "Glacier: A Hot Carrier Gate-Level Circuit Characterization Simulation System for VLSI Design" Mar. 20-22, 2000. pp. 73-79.*

Jiang et al., "Key Hot Carrier Degraddation Model Calibration and Verification Issue for Accurate AC Circuit-Level Relability Simulation" 1997 IEEE pp. 300-306.*

Kao et al., "A Modeling and Circuit Reduction Methodology for Circuit Simulation of DRAM Circuits" IEEE 1995 pp. 15-20.*

Agostinelli et al., "Universal MOSFET Hole Mobility Degradation Models for Circuit Simulation" IEEE Mar. 1993 pp. 439-445.*

Kuo et al., "Simulation of MOSFET Lifetime under AC Hot-Electron Stress" 1988, IEEE, pp. 1004-1011.*

Quader et al., "Hot-Carrier-Reliability Design Rules for Translating Device Degradation to CMOS Digital Circuit Degradation," IEEE, May 1994, pp. 681-691.*

Karam, Medhat, et al., "Implmentation of Hot-Carrier Reliability Simulation in Eldo" and related Internet material, Deep Submicron Technical Publication, dated Sep. 2000.

Lou, Choon-Leong, et al., "A Novel Single-Device DC Method for Extraction of the Effective Mobility and Source-Drain Resistances of Fresh and Hot-Carrier Degraded Drain-Engineered MOSFET's", IEEE Transactions on Electron Devices, vol. 45, No. 6, Jun. 1998, pp. 1317-1323.

Wong, H., et al., "Simulation of Hot-Carrier Reliability in MOS Integrated Circuits", PROC. 21st International Conference on Microelectronics, vol. 2, NIS, Yugoslavia, Sep. 14-17, 1997, pp. 625-628.

Hwang, Nam, et al., "Hot-Carrier Induced Series Resistance Enhancement Model (HISREM) of nMOSFET'S for Circuit Simulations and Reliability Projections", Microelectronics and Reliability, vol. 35, No. 2, pp. 225-239, Feb. 1995, pp. 225-239.

Aur, S., et al., "Modeling of Hot Carrier Effects for LDD Mosfets", 1985 Symposium of VLSI Technology, pp. 112-113.

Jiang, Wenjie, et al., "Key Hot-Carrier Degragation Model Calibration and Verification Issues for Accurate AC Circuit-Level Reliability Simulation", IEEE, 1997, pp. 300-306.

Hu, Chenming, "IC Reliability Simulation", IEEE Journal of Solid-State Circuits, vol. 27, No. 3, Mar. 1992, pp. 241-246.

Jiang, Wenjie, et al., "Assessing Circuit-Level Hot-Carrier Reliability", IEEE, 1998, pp. 173-179.

Ling, C.H., et al., "Simulation of Logarithmic Time Dependence of Hot Carrier Degradation in PMOSFETs", Semicond. Sci. Technol. 10, 1995, pp. 1659-1666.

Li, Chester C., et al., "A New Bi-directional PMOSFET Hot-Carrier Degradation Model for Circuit Reliability Simulation", IEEE, 1992, pp. 20.7.1-20.7.4.

Quader, Khandker N., et al., "A Bidirectional NMOSFET Current Reduction Model for Simulation of Hot-Carrier-Induced Circuit Degradation", IEEE Transactions on Electron Devices, vol. 40, No. 12, Dec. 1993, pp. 2245-2254.

Leblebici, Y., et al., "An Integrated Hot-Carrier Degradation Simulator for VLSI Reliability Analysis", IEEE, 1990, pp. 400-403.

Hsu, Wen-Jay, et al., Advanced Integrated-Circuit Reliability Simulation Including Dynamic Stress Effects, IEEE Journal of Solid-State Circuits, vol. 27, No. 3, Mar. 1992, pp. 247-257.

Chang, Steve S., et al., "A New MOSFET Hot Carrier Model in SPICE Feasible for VLSI Reliability Analysis", International Symposium on VLSI Technology, Systems, and Applications, Taipei, Taiwan, R.O.C., May 22-24, 1991, pp. 283-287.

Wu et al., "Full Chip Reliability Simulation to VDSM Integrated Circuits," *Celestry Design Technology, Inc.*, Sep.-Oct. 2001, pp. 1273-1278.

Seo et al., "The Hot-Carrier Degradation and Device Characteristics with Variation of Pre-Metal Dielectric" pp. 179-184, 1999, *Sch of Electr & Electron Eng, Daebul Univ, Chonnam*, South Korea.

Hu-C., "Simulating Hot-Carrier Effects on Circuit Performance," *Univ. of Cal. Berkeley*, 1992, pp. B555-B558.

Le et al., "Digital Test Circuit and Optimization of AC Hot-Carrier Reliability Characterization and Model Calibration under Realistic High Frequency Stress Conditions," *IEEE*, pp. 111-113.

Takeda, "An Empirical Model for Device Degradation Due to Hot-Carrier Injection," *IEEE*, 1983, pp. 111-113.

Aur et al., "Circuit Hot Electron Effect Simulation," *Texas Instrument*, 1987, pp. 498-501.

Kim et al., "Oxide-Field Dependence of the NMOS Hot-Carrier Degradation Rate and Its Impact an AC-Lifetime Prediction," *IEEE*, 1995, pp. 37-40.

Chen et al., Statistical Variation of NMOSFET Hot Carrier Lifetime and its Impact on Digital Circuit Reliability, *IEEE*, 1995, pp. 29-32.

* cited by examiner

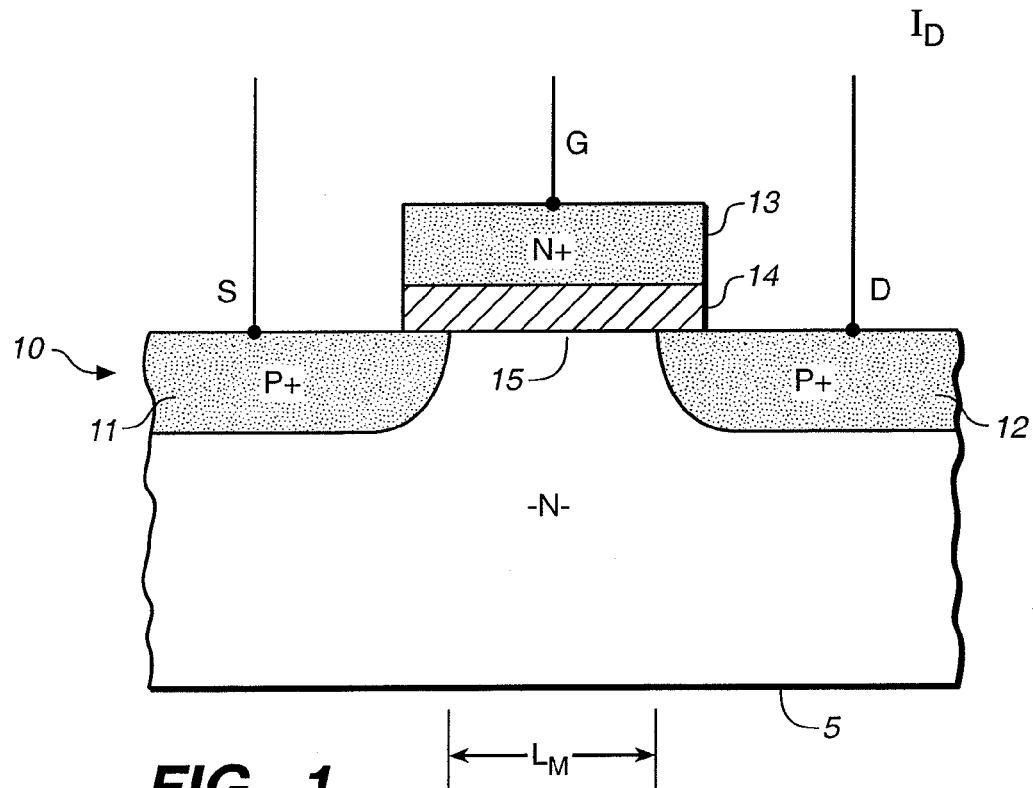
FIG._1
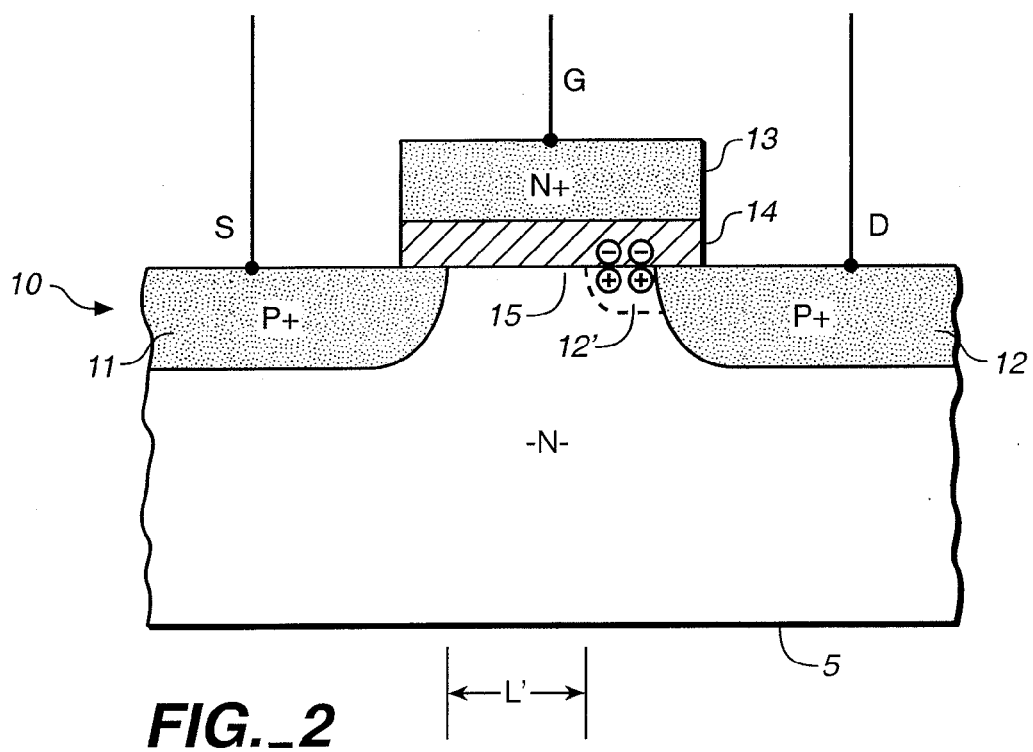
FIG._2

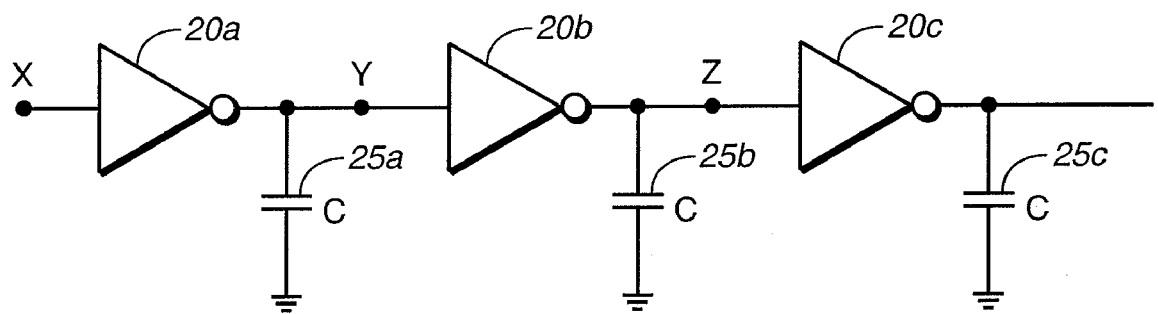
FIG._3
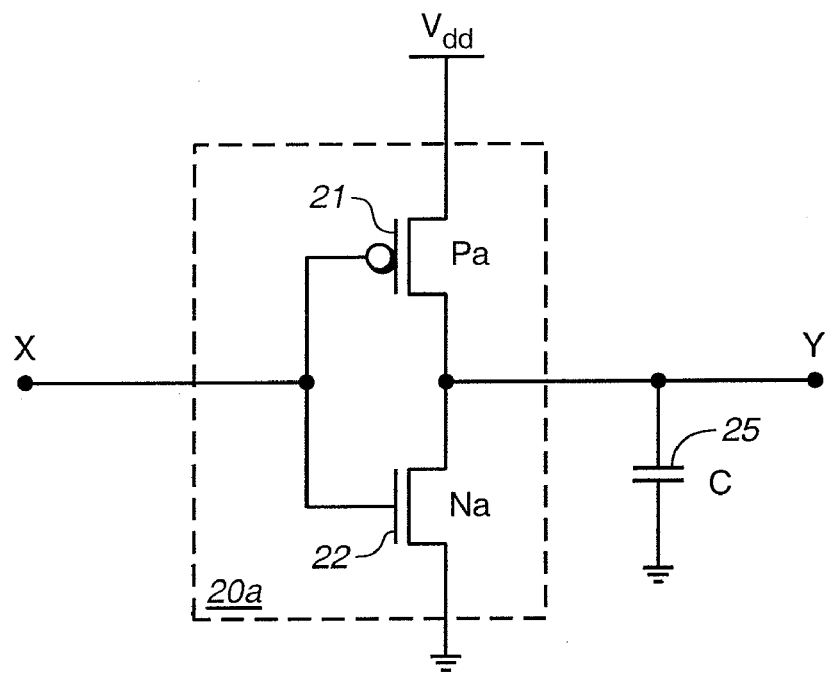
FIG._4

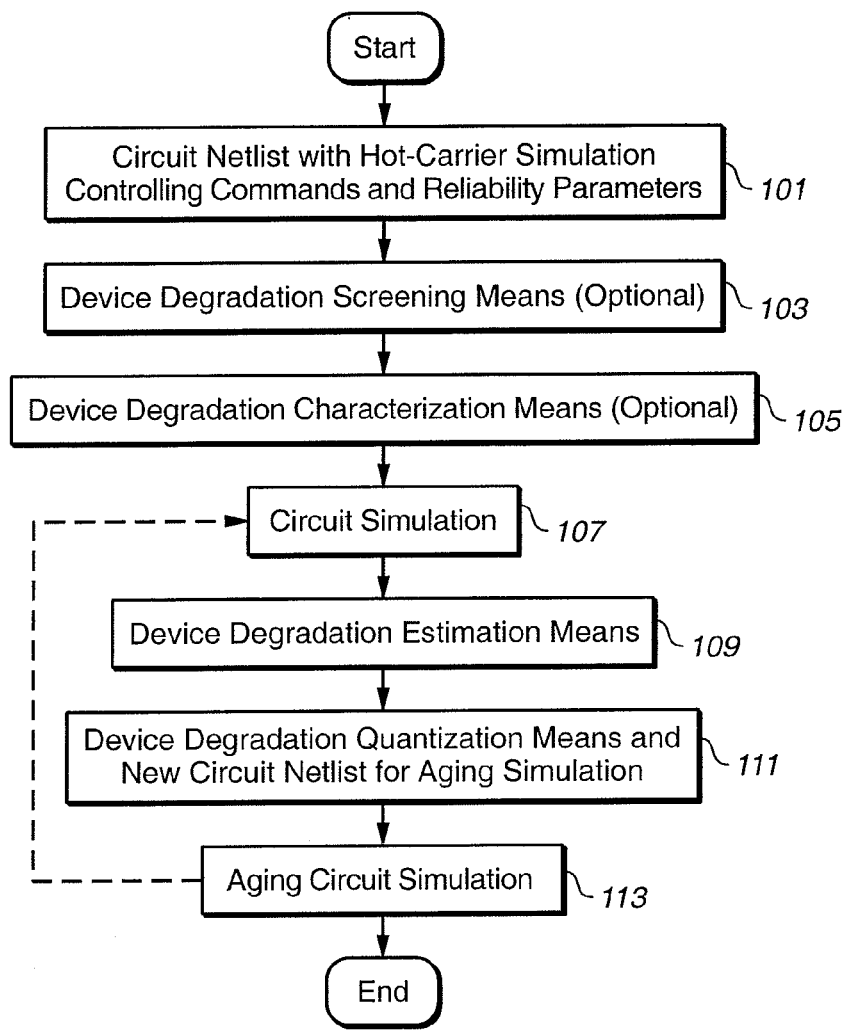
FIG._5
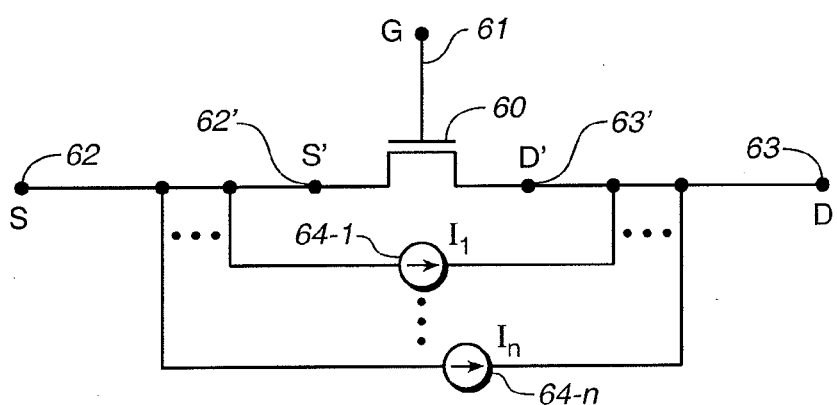
FIG._6

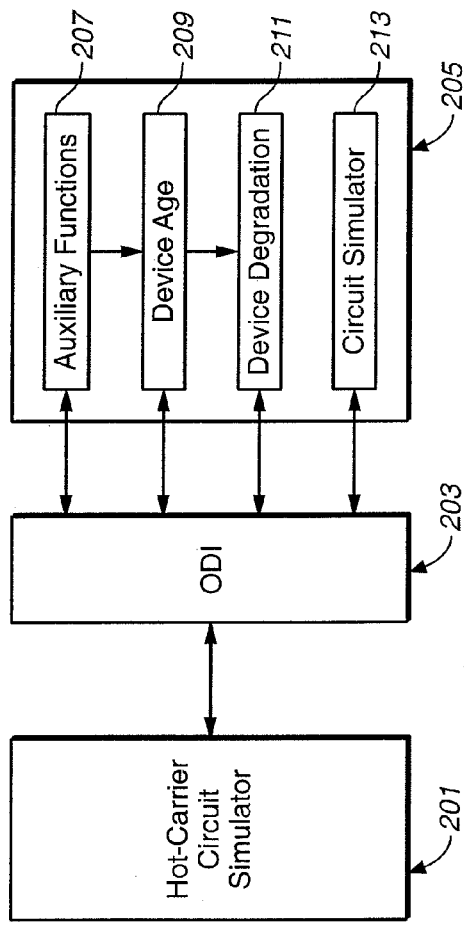
FIG._7
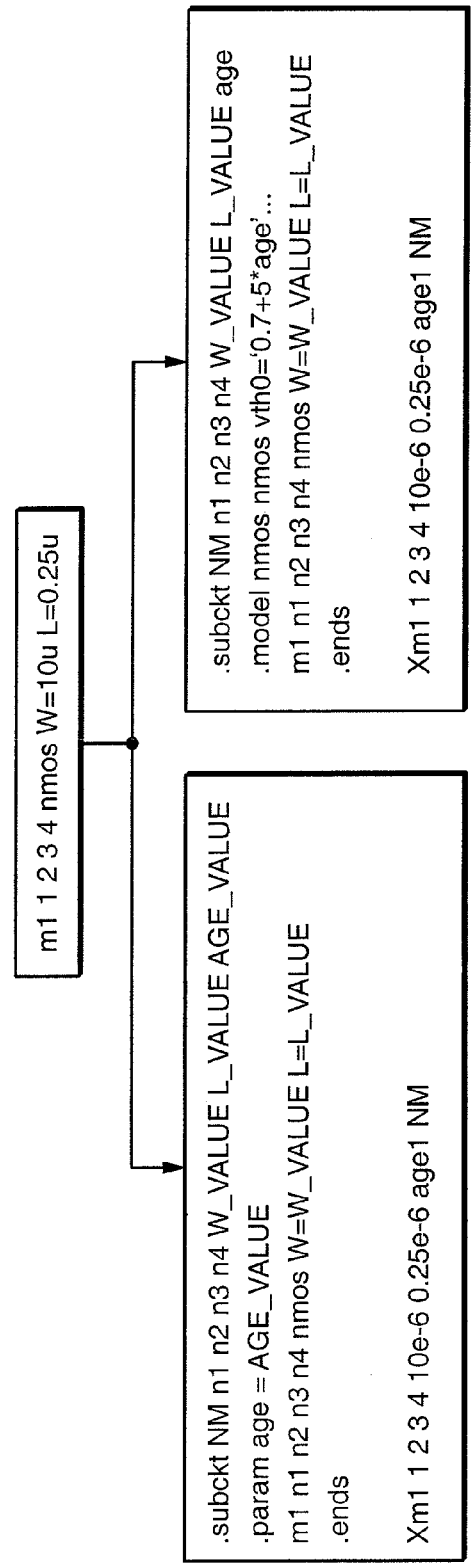
FIG._8

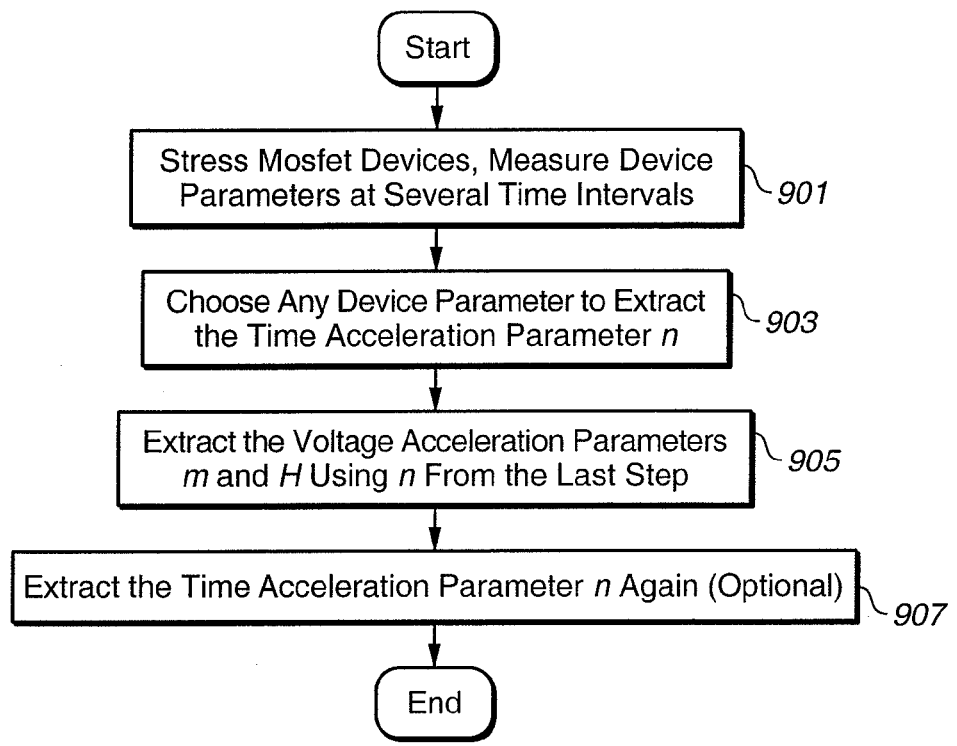
FIG._9
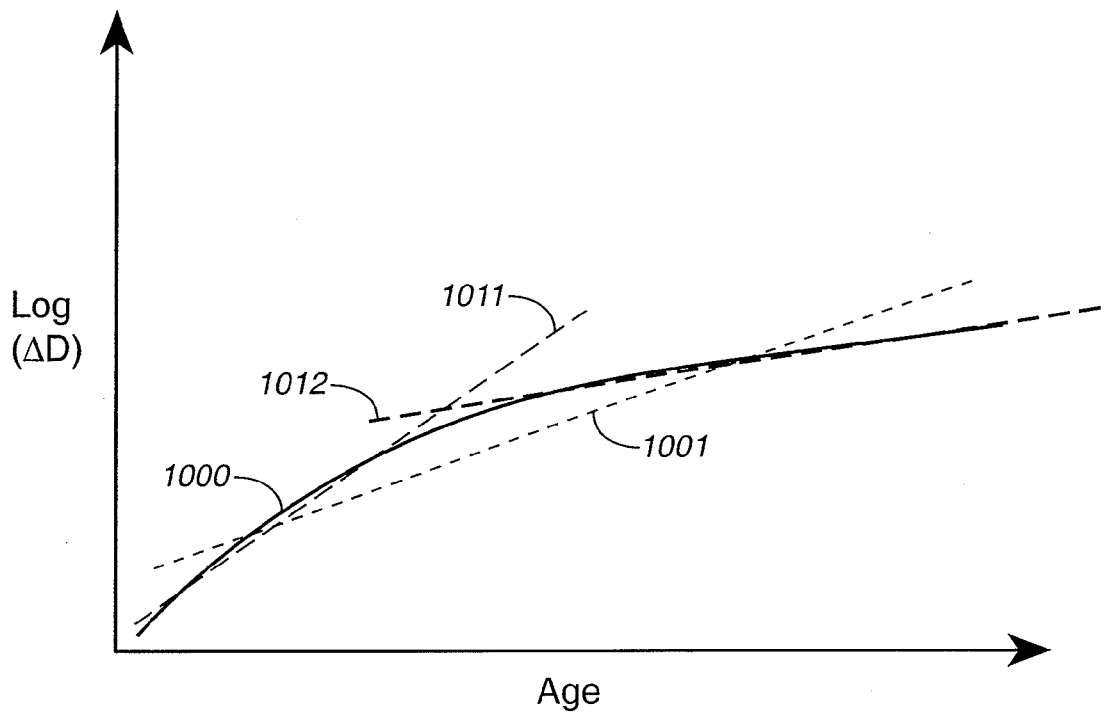
FIG._10

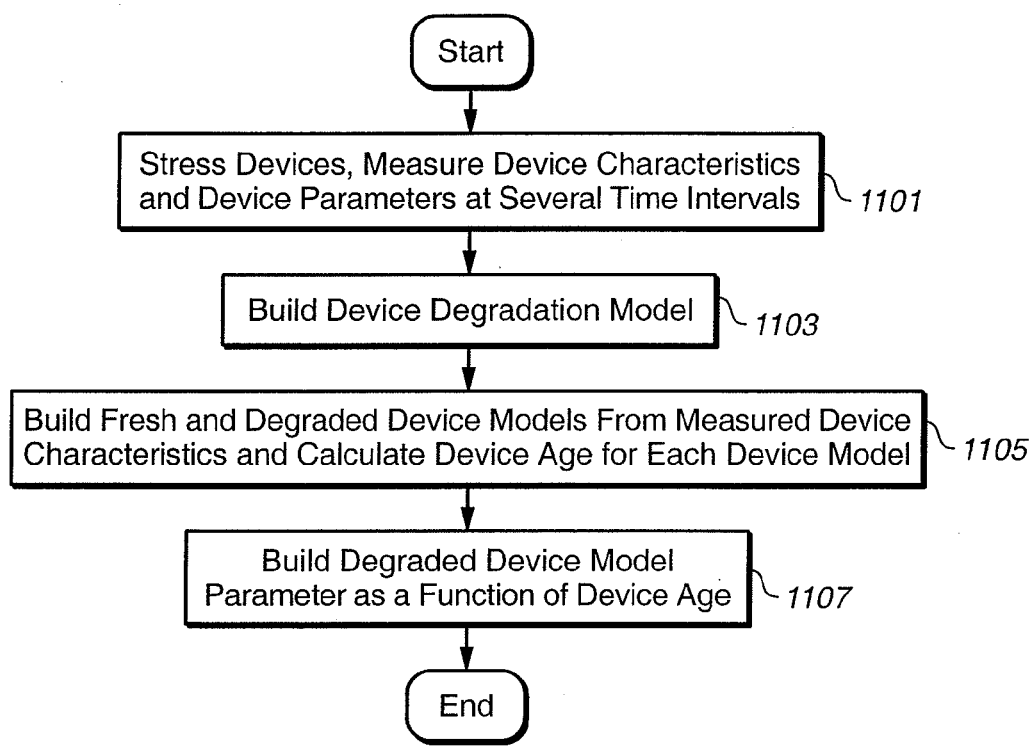
FIG._11
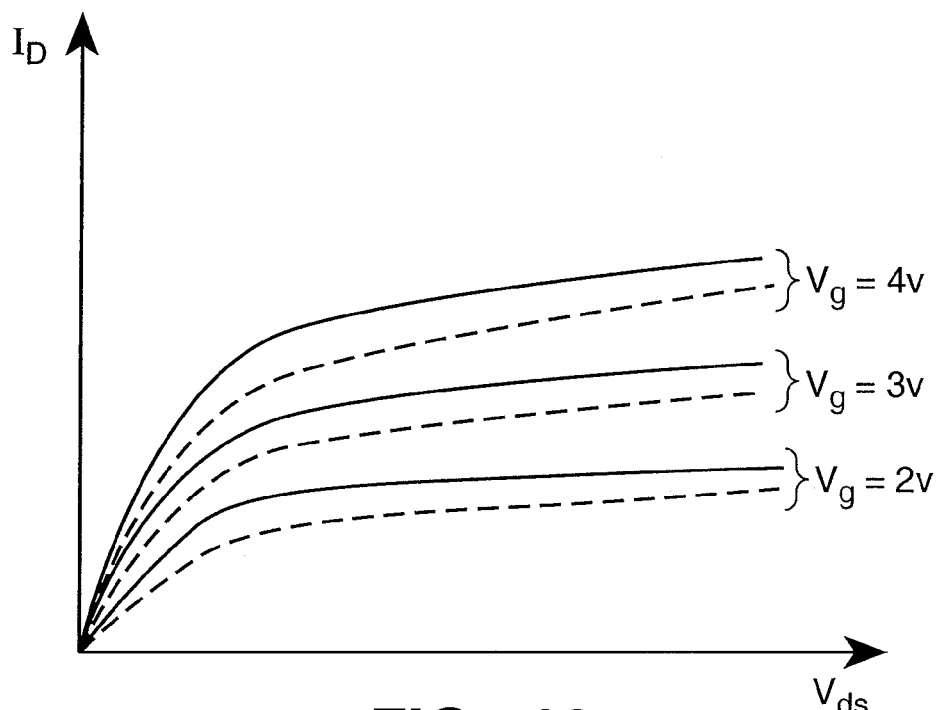
FIG._12

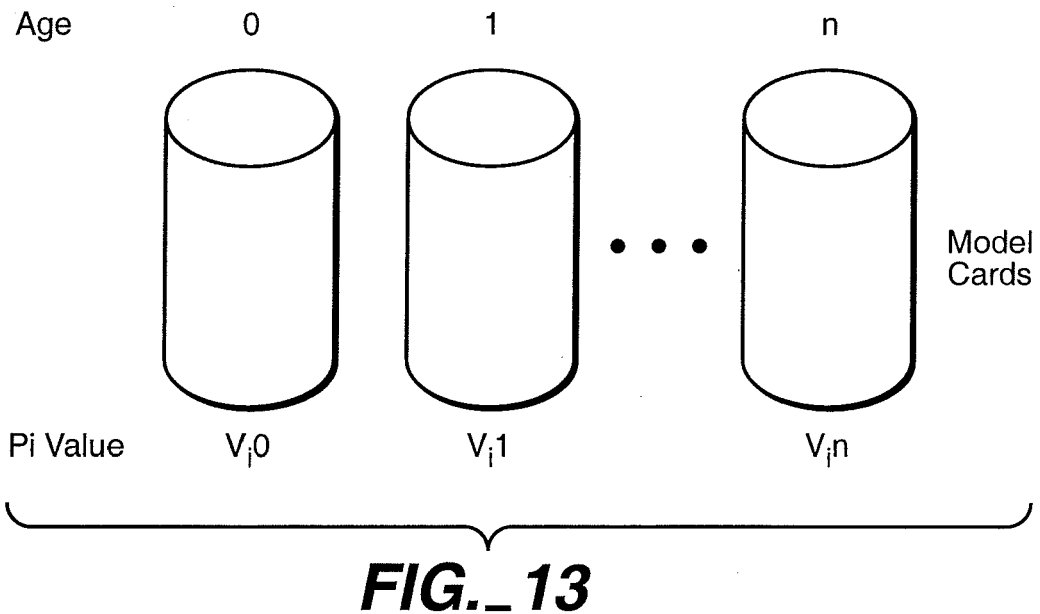
FIG._13
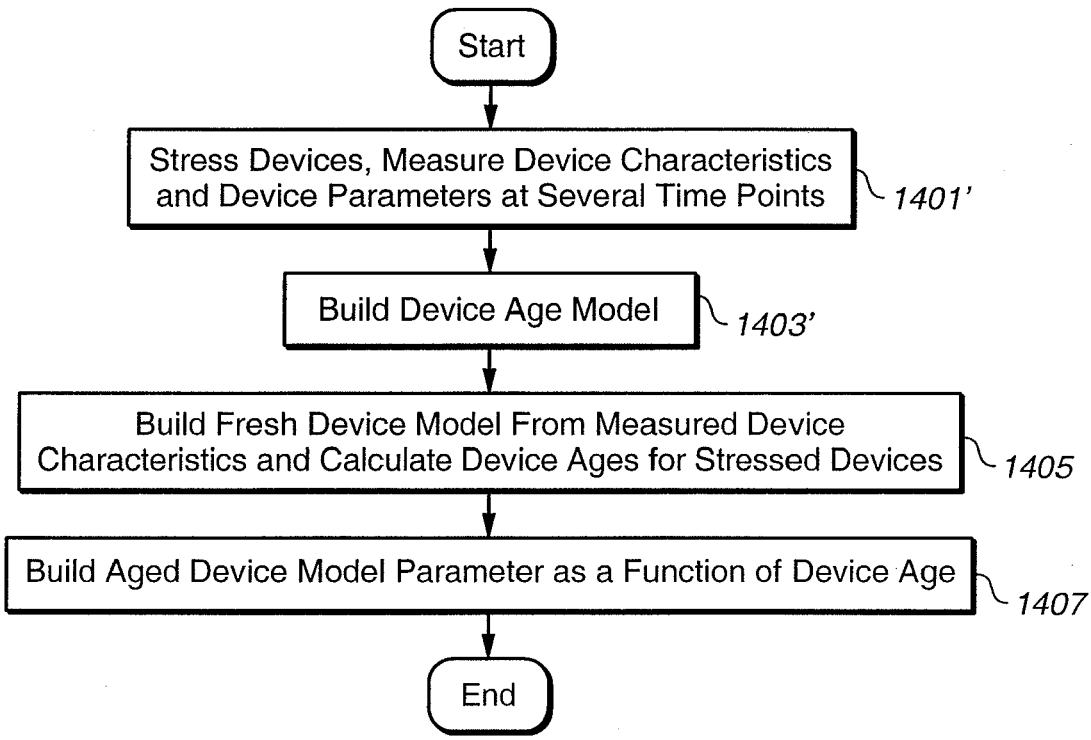
FIG._14

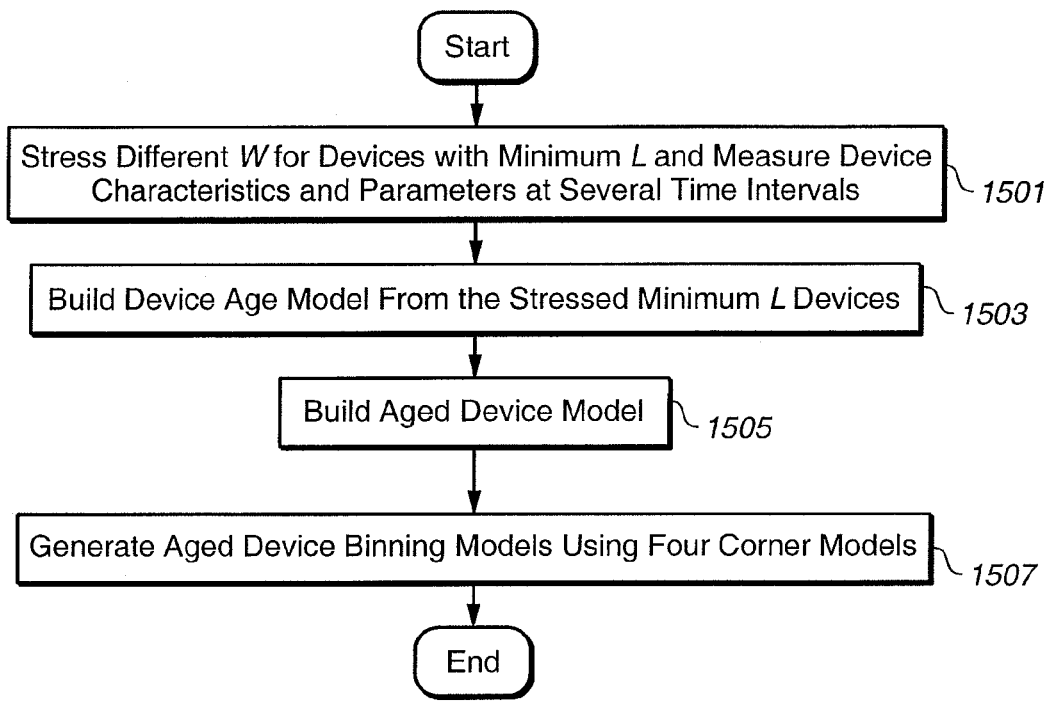
FIG._15
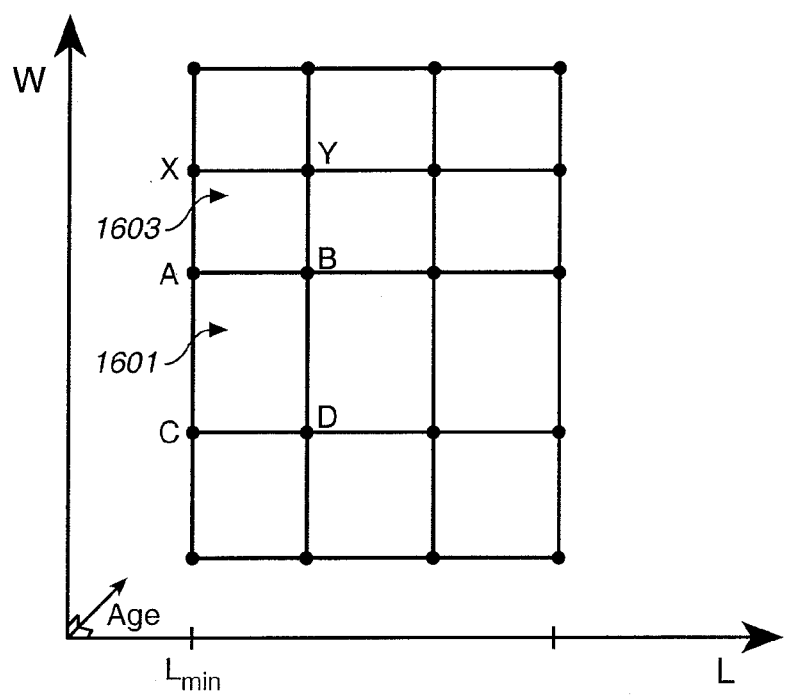
FIG._16

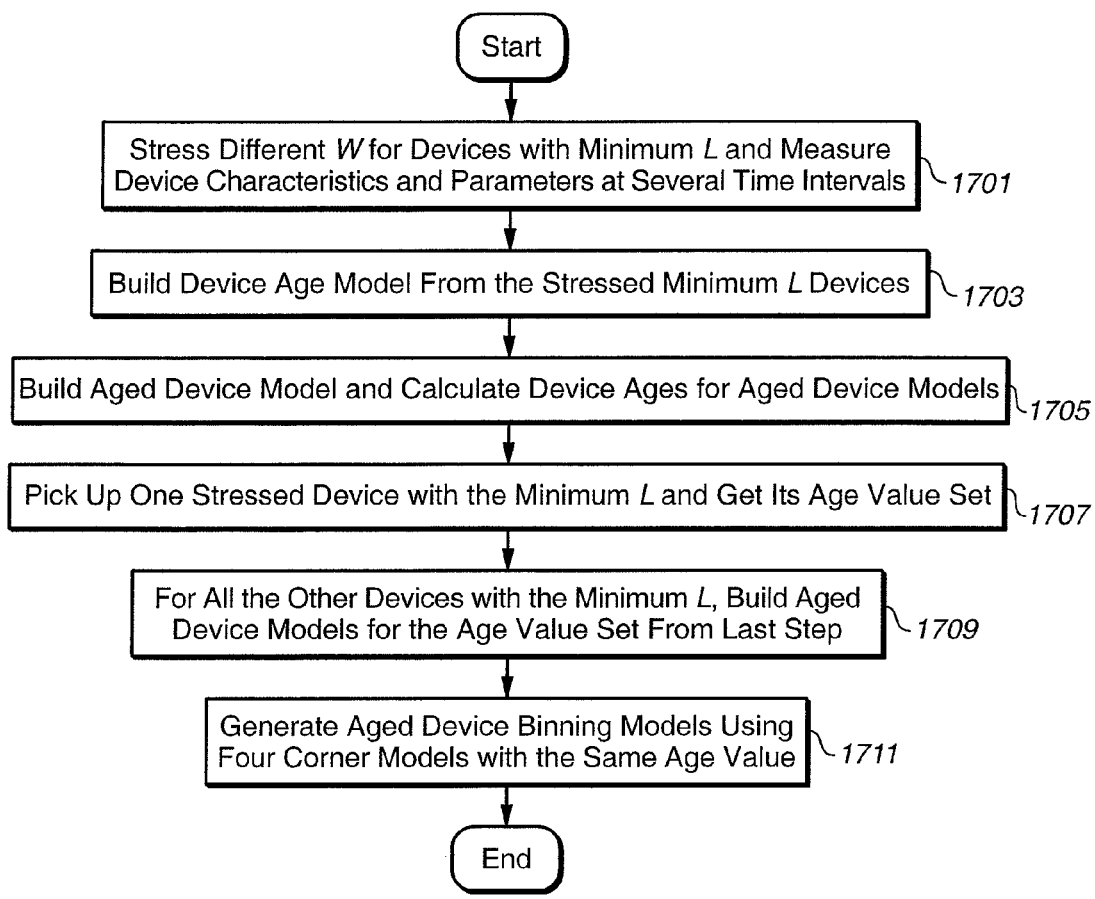
FIG._17
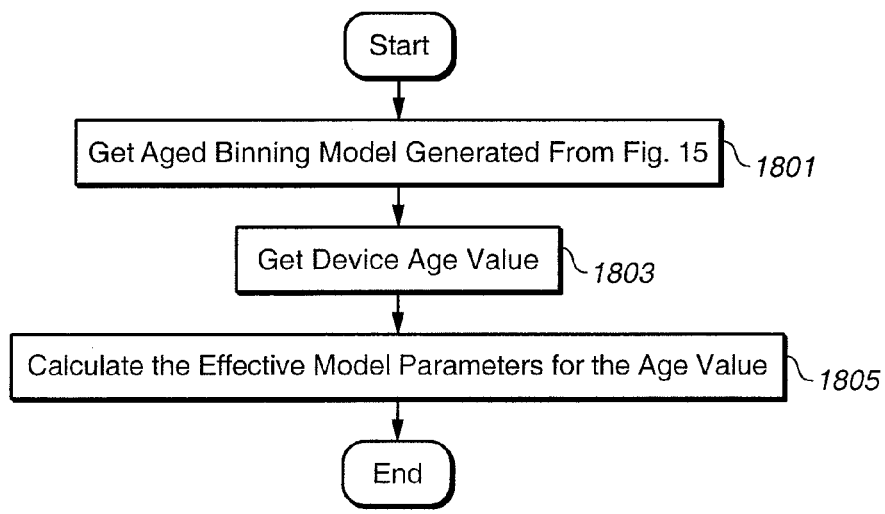
FIG._18

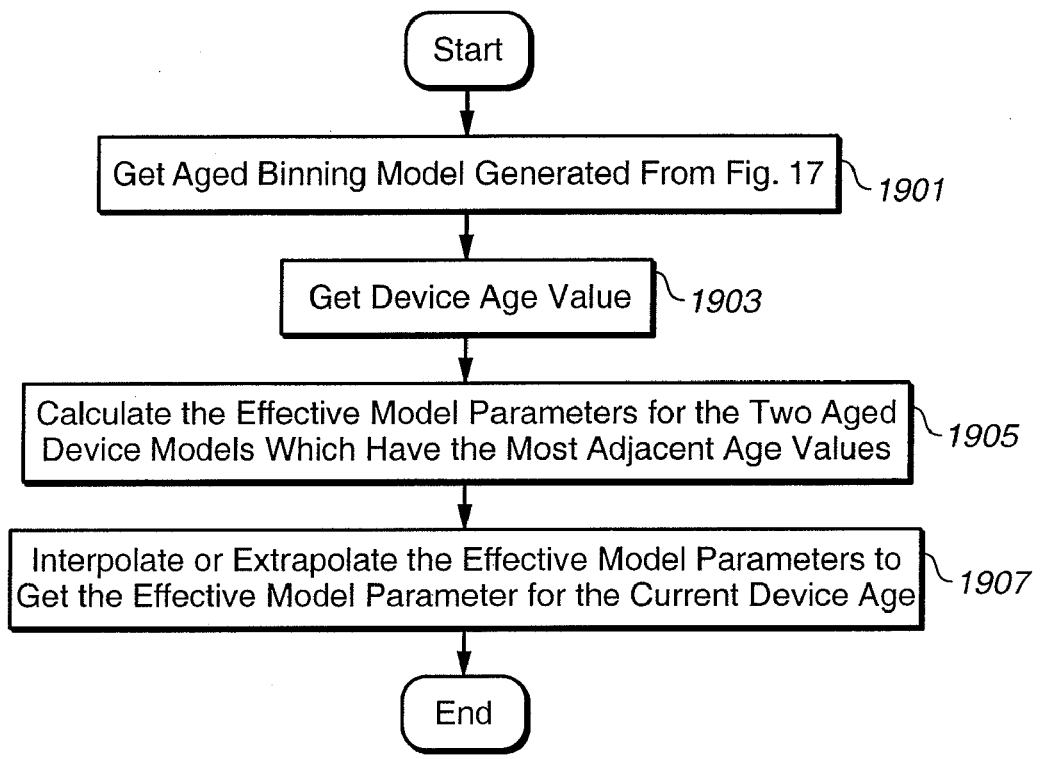
FIG._19
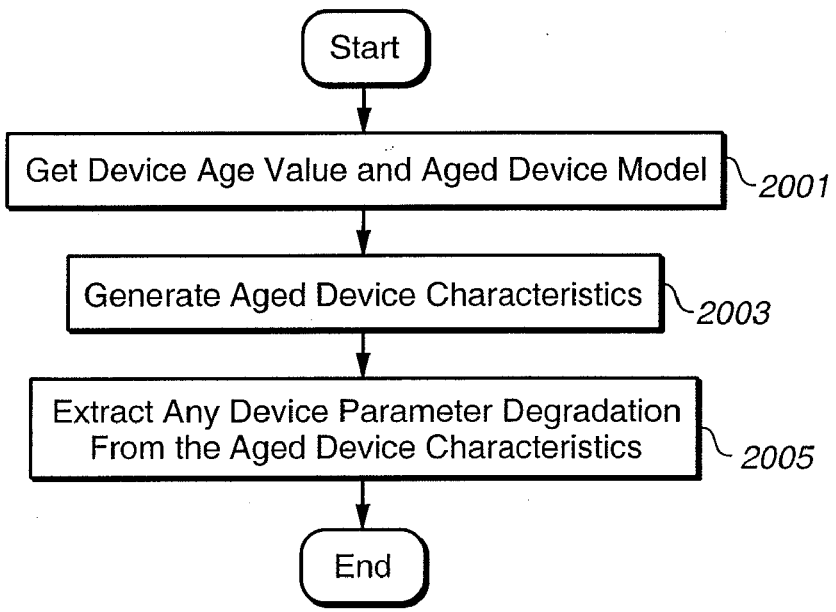
FIG._20

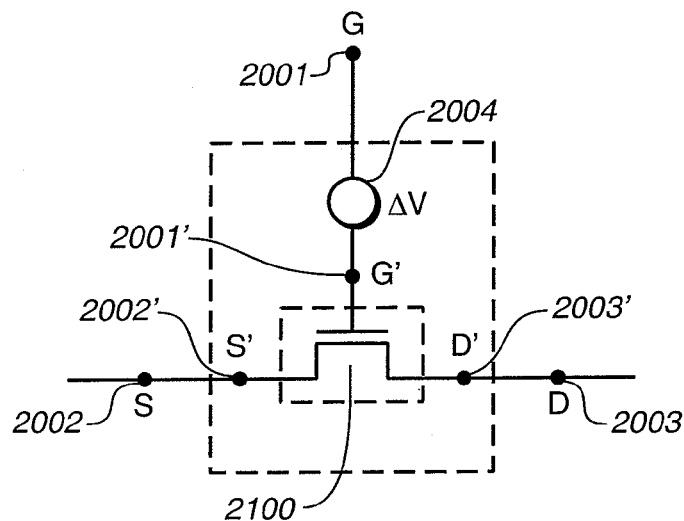
FIG._21
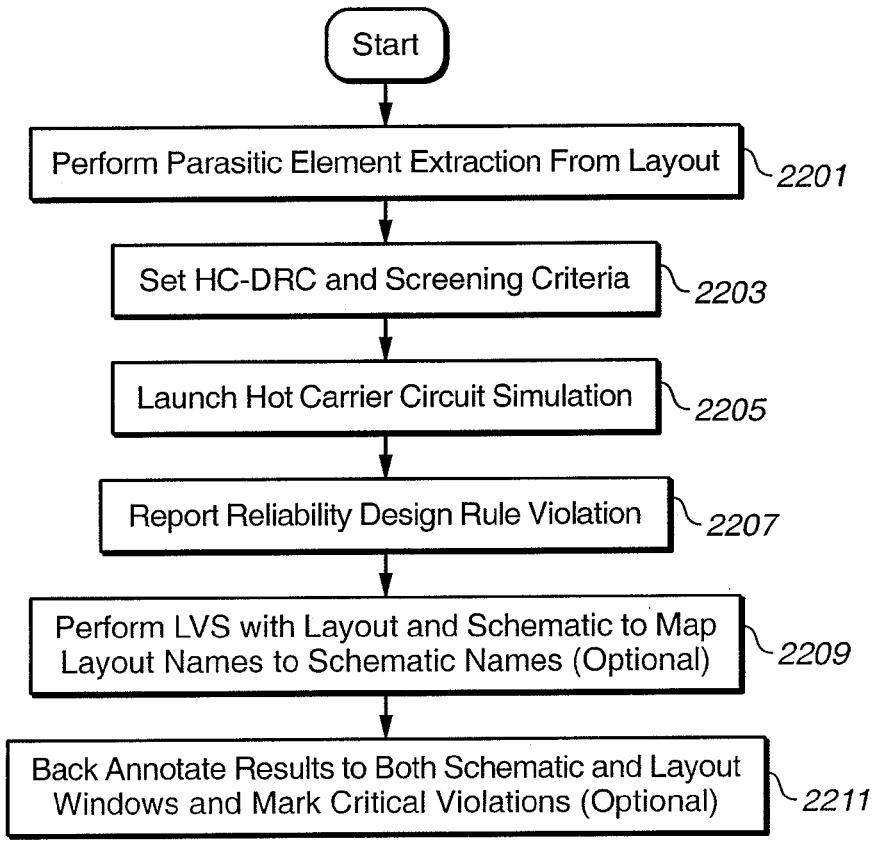
FIG._22

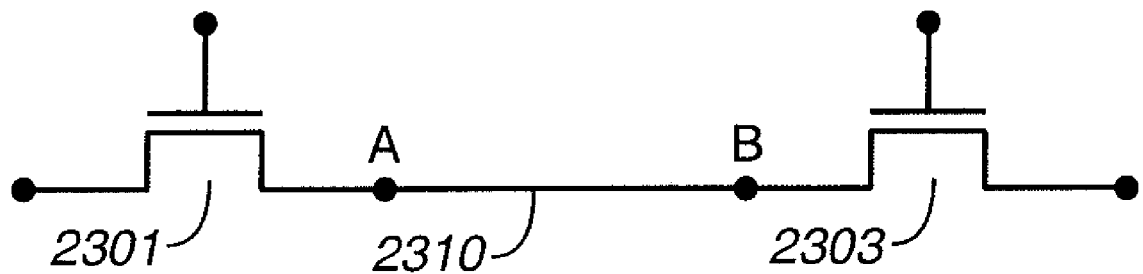
FIG._23a
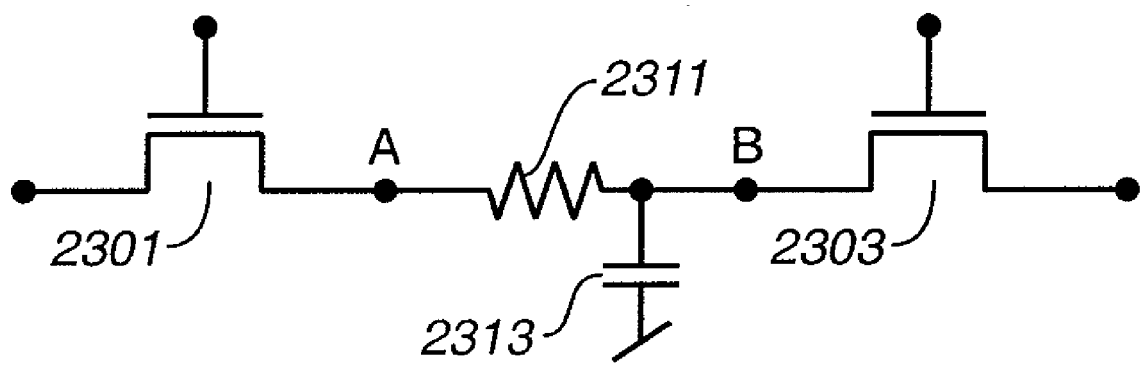
FIG._23b

HOT-CARRIER RELIABILITY DESIGN RULE CHECKER

CROSS REFERENCE TO RELATED APPLICATIONS

This application is a Continuation in Part of U.S. patent application Ser. No. 09/832,933, filed on Apr. 11, 2001, is related to a U.S. application entitled "Hot-Carrier Device Degradation Modeling and Extraction Methodologies", filed concurrently with the present application, and claims priority from the following provisional U.S. patent applications: Ser. No. 60/236,865, entitled "Hot-Carrier Circuit Reliability Simulation", filed 29 Sep., 2000; 60/236,587, entitled "Hot-Carrier Device Degradation Modeling and Extraction Methodologies", filed 29 Sep., 2000; and 60/236,586, entitled "Hot-Carrier Reliability Design Rule Checker", filed 29 Sep., 2000.

The above referenced applications are incorporated herein by reference for all purposes. The prior applications, in some parts, may indicate earlier efforts at describing the invention or describing specific embodiments and examples. The present invention is, therefore, best understood as described herein.

FIELD OF THE INVENTION

This invention relates generally to a design aiding apparatus and methods for the design of integrated circuits, and, more specifically, to methods for simulating the time degradation of a circuit and its components.

COPYRIGHT NOTICE

A portion of the disclosure of this patent document may contain materials that are subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Complementary metal oxide semiconductor (CMOS) circuits may contain thousands or millions of transistors and other circuit elements. The design of such circuits is extremely complicated and usually employs simulators, such as SPICE, to predict circuit operation. In addition to predicting the operation of the circuit when it is new, it is frequently important to simulate the operation of the circuit as it ages from processes such as hot carrier effects.

FIG. 1 is a schematic of a field effect transistor, the example here being a P-channel MOSFET formed on a silicon substrate, although much of the following discussion applies NMOS transistors and other insulated gate devices. This device may also have a lightly doped drain (LDD) region that is not shown in FIG. 1. Some of the particulars for the NMOS case will be discussed later. The transistor 10 has a bulk N-type region 5, source region 11 and drain region 12 defined at and below the substrate surface, and a lightly doped N-type channel region 15 having a manufactured length $L_M$ in the region between the source 11 and the drain 12. Over the channel region is an oxide or other insulating layer 14 that supports the gate 13. (Here the gate is shown doped as N+, although in a PMOS this may alternately be P+.) When the transistor is turned on, current flows through the channel region below the oxide/silicon interface.

With operation over time, the PMOS transistor 10 will suffer degradation due to device aging. An important mechanism in the aging of insulated gate devices is the "hot carrier" effect. When the transistor is turned on, a current $I_{ds}$ of energized charge carriers flows through the channel 15 from the source 11 to the drain 12. Impact of these charge carriers near the channel/drain juncture generates electron-hole pairs. Some of the resultant electrons have sufficient energy to pass through the insulating layer 14 by tunneling or other leakage mechanisms and are then collected at the gate 13, resulting in a gate current $I_G$. The rest of the electrons result in a substrate current $I_{sub}$ contribution, with generated holes adding to the drain current $I_{ds}$. Some of the impact induced electrons become trapped inside of the insulating layer 14 or become trapped at the interface of the channel 15 and the insulating layer 14. This attracts holes to the channel side of the channel/insulator interface, which cause the effective boundary of the P+ drain region 12 to shift closer to the source region. This is shown in FIG. 2, where drain is extended by the region 12', shortening the effective channel length to $L'<L_M$. Additionally, the oxide/silicon interface above channel region is damaged by the more energetic holes and electrons.

These effects degrade the transistor's operation in several ways. As these charges accumulate, the voltage needed at the gate to turn on the transistor, the device's threshold voltage $V_{th}$, changes, resulting in positive shift, $\Delta V_{th} > 0$. This makes the PMOS threshold voltage less negative and reduces the $V_{th}$ value at which the onset of leakage current is seen. When a sufficient number of trapped electrons are distributed over the manufactured length $L_M$ of the channel 15, a relatively large leakage current will flow through the transistor even when the gate voltage $V_G$ is set to an "off" level.

The damage to the interface results in a lower mobility, $\mu$, as the carriers flow form source 11 to drain 12. The lower mobility results in more resistance and lowers $I_{ds}$, where as the electrons trapped in the dielectric tend to raise the PMOS's $I_{ds}$ curve. The strength of these effects depend differently on bias conditions, but traditionally the change due to lower mobility has been smaller; however, as device sizes have decreased, this interface damage becomes more significant and, depending upon bias conditions, often becomes the larger effect below a quarter micron or so.

These problems are aggravated as device sizes decrease into the submicron region. One reason is that an amount of incursion of the region 12' that produces a relatively small relative change for a channel length of, say, $L_M \approx 1.5$ μm becomes a much larger relative change at $L_M \approx 0.25$ μm. For example, if 12' extends an absolute distance of 0.05 μm, this produces a change of $$\frac{(L' - L_M)}{L_M} = -20\%$$

for the shorter channel length, but of only −3% at the longer length. Another reason is that as the electric field in the channel is given by $$E = \frac{V_{ds}}{L},$$

the resultant field strength, and consequently the number of electron/hole pairs produced, increases greatly in a submicron device even at low power operation. For example, in a $L_M \approx 0.25$ μm MOSFET operating at 2.5 volts results in fields of $\approx 10^7$ V/m. As L' departs further and further from $L_M$, the field strengths increase resulting in an even greater electron/hole pair production rate.

In the case of an NMOS transistor, the results of hot-carriers differ in several respects. Electrons will again be trapped in the dielectric and as the number of electrons in the oxide increases, a positive shift in voltage will again be needed at the gate to turn on the transistor results, $\Delta V_{th} > 0$. As $V_{th}$ is positive now, the threshold voltage becomes larger in magnitude and the $I_{ds}$ curve is lowered as the gate voltage must additionally overcome the negative charge embedded in the dielectric to cause the channel inversion.

The damage to the interface again lowers the mobility, μ, as the electrons flow form source 11 to drain 12, resulting in more resistance and lowering $I_{ds}$. Thus in this case, both effects move the $I_{ds}$ curve in the same direction. Also as with the PMOS, the strength of these effects depends differently on bias conditions, with the change due to lower mobility traditionally smaller but becoming increasingly important as device size shrink. Unlike the PMOS, though, the effective channel length does not decrease.

These hot electron effects build up over time causing the device to degrade as it ages. To determine the aging of a circuit as a whole, the degradation of the various devices within the circuit must be considered. As an example, consider the simple circuit shown in the schematic of FIG. 3, consisting of three inverters manufactured to be identical.

FIG. 3 shows three inverters, 20a, 20b, and 20c, connected in parallel with a capacitive load C 25a, 25b, and 25c connected to the output of each. Each of these inverters consists of a circuit like that of FIG. 4, with a PMOS transistor $P_a$ 21 and an NMOS transistor $N_a$ 22 connected as shown. To simulate the fresh circuit, a circuit simulation, such as of the SPICE or timing simulation type, can be performed using the same model card for each of PMOS transistors 21 and the same model card for each of the NMOS transistors.

To simulate the aged circuit, a model card representing the aged behavior of each of the elements needs to be used. To determine how the aged device will operate, the device is stressed to obtain the aging model information from the electrical test data. From this, the aged model card for the device can be extracted. However, the same aged model card can no longer be used for all of the similar devices. To see why, consider FIG. 3 again.

The amount of degradation in the PMOS 21 and the NMOS 22 of inverter 20a depends on the input signal supplied at node X, while the degradation in inverters 20b and 20c will instead depend on the input at nodes Y and Z, respectively. The waveforms at these nodes will differ from each other as the input waveform will change in both shape and magnitude as it propagates through the circuit. Thus, if the operation of a circuit after, say, 5 years, of use is simulated, the relative amount of degradation in each of the inverters will differ and, consequently, a different aged model card will be needed for each of the transistors. For even the simple circuit of FIGS. 3 and 4, this results in a three-fold increase in the required number of model cards for the aged circuit simulation compared with the fresh circuit. As a real circuit will often contain thousands or even millions of elements, the simulation of the aging of such circuits is a extremely complicated process for which a large number of improvements are desirable.

SUMMARY OF THE INVENTION

The present invention is directed to a number of improvements in methods for reliability simulations in aged or otherwise degraded circuits whose operation has been degraded through hot-carrier or other effects. One aspect of the present invention allows design rules on degradation to be included in the netlist. Once the hot-carrier circuit simulation is launched, the rules are checked and the reliability design rule violations are reported. The process can be performed on either the layout or schematic window. The design rule criteria can be any device parameter and can be expressed in absolute or relative terms. The criteria can be based on device type, model card name, instance geometry, or temperature. Additionally, values can be set prior to beginning the simulation.

Additional aspects, features and advantages of the present invention are included in the following description of specific representative embodiments, which description should be taken in conjunction with the accompanying drawings.

BRIEF DESCRIPTION OF THE DRAWINGS

FIG. 1 is a schematic drawing of a MOSFET transistor.

FIG. 2 shows the effects of aging due to the "hot-carrier" effect in the device of FIG. 1.

FIG. 3 is a schematic of a simple circuit used to discuss the effects of aging on a circuit.

FIG. 4 is a detail of the circuit of FIG. 3.

FIG. 5 is a flow chart of hot-carrier circuit simulation.

FIG. 6 shows multiple current sources to represent different degradation mechanisms for a MOSFET.

FIG. 7 is a block diagram of an interface for use in hot-carrier or other aging simulation.

FIG. 8 shows the entry of MOSFET in a netlist converted to a parameterized aged device model subcircuit call.

FIG. 9 is a flow chart for building a device degradation model.

FIG. 10 shows a typical relation between device degradation and device age.

FIG. 11 is a flow chart of a first embodiment for building degraded device model.

FIG. 12 shows exemplary fresh and degraded current vs. voltage curves.

FIG. 13 is a schematic representation of degraded model files.

FIG. 14 is a flow chart of a second embodiment for building degraded device model.

FIG. 15 is a flow chart of a first embodiment for building a degraded binning model.

FIG. 16 illustrates the concept of binning.

FIG. 17 is a flow chart of a second embodiment for building a degraded binning model.

FIG. 18 is a flow chart for the binning using the first embodiment for building a degraded binning model.

FIG. 19 is a flow chart for the binning methodology of the second embodiment for building a degraded binning model.

FIG. 20 is a flow chart for generating degradation on any device parameter.

FIG. 21 shows an embodiment for representing a degraded device as a fresh device combined with a voltage source connected to a terminal.

FIG. 22 is a flow chart for a hot-carrier reliability design rule checker.

FIGS. 23a and 23b illustrate the extraction of parasitic elements.

DESCRIPTION OF REPRESENTATIVE EMBODIMENTS

The different aspects of the present invention will be presented in the various sections below. Although the discussion is mainly in terms of device age due to hot carriers, this process can be based on any intermediate quantity indicative of the level of device degradation and not just "age"; but to simplify the terminology, the discussion below is mostly presented in terms of the common case of age. In addition, the techniques generally apply to circuit degradation due to the degradation of its constituent devices from mechanisms other than hot carrier effects.

Hot-Carrier Circuit Simulation

The various aspects of the hot-carrier circuit simulation portion of the present invention will be described with respect to the flow chart of FIG. 5. As described in the following, this flow differs from the prior art methods, such as presented in U.S. Pat. No. 6,278,964, entitled "Hot Carrier Effect Simulation for Integrated Circuits", which is hereby incorporated by reference, in some of the steps included as well as in the details of some of the steps that are found in the prior art.

Step 101 provides the netlist describing the circuit that will have the simulation controlling commands and reliability parameters of the present invention. This will include the various connections of the circuit elements and model cards for these elements as well as the age models. The age models may be those that are described below in the "Modeling and Extraction Methodologies" section. In one improvement over the prior art, multiple hot-carrier circuit simulations can be accomplished in one run with one circuit simulation by setting proper hot-carrier simulation commands. This will improve simulation efficiency.

In the prior art flow, each run of a hot-carrier circuit simulation would require a complete run of all of the steps in the flow. For example, to simulate the operation of the circuit and determine its degradation after, say, 5 years and 10 years, a complete simulation would be performed for each of these values. Referring to FIG. 5, step 107 typically consumes by far the most time. By combining the simulation for multiple values, all of these stress times can be simulated with just one run of step 101–107. Although steps 109, 111, and 113 will each be performed for each parameter, by only requiring one simulation for the early steps—and particularly step 107—efficiency is greatly improved.

Another improvement of the present invention found in step 101 is that different device lifetime criteria can be applied for different circuit blocks, circuit block types, devices, device models, and device types in one or multiple hot-carrier circuit simulations. Examples of different lifetime criteria include using parameters such as $I_{ds}$ at different bias conditions, device transconductance, threshold voltage, model parameters, and so on for determining the amount of degradation. These criteria are parameters measurable before and after a circuit element is stressed and that are computable to use as a gauge of device degradation. The different criteria can be important in different areas of the circuit. For example, a circuit may contain both an analog block and a digital block of elements. The important degradation characteristics of these blocks may differ, with, say, transconductance $G_m$, $V_{th}$, or some other voltage behavior being used in the analog elements while for a digital part it would be driving capability of $I_{ds}$ or the circuits delay or speed. The different criteria can be important in determining individual device lifetime and setting a threshold value below which the device becomes unacceptable for circuit performance requirements, for example, when $I_{ds}$ or $G_m$ at some bias is degraded below a certain value.

Even when circuit blocks are of the same type, such as both being adders or inverters, different criteria can be applied if the degradation of the blocks can best be quantified by different parameter values. These criteria may be different device parameters, such as the gain $G_m$ or threshold values $V_{th}$, or the same parameter but with different values, say a $V_{th}$ shift of 100 mV in one block and 200 mV in another.

Similarly, differing criteria can be used for different devices, with say one criterion for PMOS and one for NMOS as these may have differing degradation mechanisms; for different models of the same device, such as an NMOS with different model cards due to, say, different sizes; or for different device types, as the important criteria for a MOSFET differ from those of a diode, which both differ from those of a bipolar junction transistor, and so on. For example, while driving capability may be important for both NMOS and PMOS devices within a given circuit block, leakage current may only be important for a PMOS in another block; or while driving capability may be the important quantity in MOSFETs, in a bipolar junction transistor the important performance criterion may be, say, emitter-base leakage current or current gain, $\beta = I_c/I_d$.

At step 103, the device degradation screening means allows a user to assign different amounts of device age, degradation and/or lifetime for different circuit blocks, circuit block types, devices, device models, and device types in absolute or relative scales. For those devices which have pre-specified degradations, the computation of their degradations can be skipped. Relevant device characterizations (shown in step 105) can also be skipped. This will improve simulation efficiency and reduce memory usage. This step is optional.

For example, in a circuit with an analog block and a digital block, it may be found that the analog block does not limit circuit life. The user could set this block as already having a specific absolute degradation value for better speed. Alternately, as a PMOS device usually suffers less degradation than an NMOS, the user could assign a smaller relative scale: If an NMOS ages amount x, the corresponding PMOS would age $\alpha \cdot x$, where $\alpha < 1$ is a proportionality parameter. In the circuit of FIGS. 3 and 4, setting a relative PMOS value would cut the transistor degradation calculations in half as the value used for PMOS 21 would be obtained from that of NMOS 22 instead of requiring a independent calculation.

The device degradation characterization means of step 105 is an optional step that characterizes the device degradation building tables which can be used during hot-carrier circuit simulation for device age, degradation and lifetime computations. The tables can be built during the hot-carrier circuit simulation or as part of a stand-alone process. In a stand-alone, a new table can be produced as part of a partial simulation ran for this purpose or be provided from another source. The tables can also be re-used for further simulations.

Different forms of table can be built. The ART (Age Rate Table) approach is one of the forms which builds a device age rate table under various bias conditions and which makes the device age calculation more efficient. Some other forms, such as an $I_{sub}$ table, an $I_{gate}$ table, and $I_{sub}/I_{ds}$ table for MOSFET transistors eliminate the need of $I_{sub}$ and/or $I_{gate}$ calculation which reduces the computation cost of MOSFET device degradation.

For example, the change in device age over a time δ t due to hot-electrons may be expressed in one model for an NMOS as $$\delta Age(t) = \frac{I_{ds}}{WH}\left(\frac{I_{sub}}{I_{ds}}\right)^m \delta t,$$

where H and m are the model's device degradation parameters and W is the devices channel width, and for a PMOS as $$\delta Age(t) = \left[W_g \times \frac{1}{H_g}\left(\frac{I_{gate}}{W}\right)^{mg} + (1-W_g) \times \frac{I_{ds}}{WH}\left(\frac{I_{sub}}{I_{ds}}\right)^m\right]\delta t,$$

where $H_g$ and mg are degradation parameters to include the gate current of the PMOS and $W_g$ is a weighting parameter. The age rate in the NMOS aging model above is then $$\text{rate} = \frac{\delta Age(t)}{\delta t} = \frac{I_{ds}}{WH}\left(\frac{I_{sub}}{I_{ds}}\right)^m \neq f(t),$$

that, for a sufficiently small δ t, is a time invariant quantity that can be saved as a table. These formulae show how the current ratios are related to the device's age and that the larger the stress time t, the greater the age. For example, as these currents are functions of the bias voltages, $I_{ds}$, $I_{sub}$=f ($V_{ds}$, $V_{gs}$, $V_{bs}$), these intermediate parameter values can be saved in a three dimensional table of $V_{ds}$, $V_{gs}$ and $V_{bs}$, or in a reduced dimensionality table if, say $V_{bs}$ is less important and the user wants to save memory. This intermediate quantity table can then be used whenever the parameter comes up. This can be implemented as a command, say table, to specify the values, .table Vds_start, Vds_stop, Vds_step, Vgs_start, Vgs_stop, Vgs_step or set up structure for the table. Tables can be in even or non-even steps.

The table can be provided before the simulation from an outside source, such as test data, since it is only for single device and does not need the netlist. Alternately, a simulation can be run just for producing such a table. The table size can be chosen by the user as this is a trade off between memory size and speed/accuracy. However, once the table is produced it can be saved for future use and not be rebuilt every time it is required. Additionally, the table can be built incrementally, with entries added for better resolution. The use of tables can also improve the simulation accuracy. If the table size is large enough, it will be more accurate than calculating on the fly.

The device degradation characterization means can be embedded into the circuit simulation of step 107. If a user has their own simulator for step 107 and source code or interface functions, step 105 can be combined into step 107. The advantage of keeping step 105 separate from step 107 is that the steps outside of 107 can be independent of simulator type.

Step 107 can be a standard prior art simulation and uses the fresh model. The possible circuit simulations could, for example, be a SPICE simulator (such as HSPICE or Spectre) or a timing simulator (such as Starsim or Timemill). As this produces the fresh waveform at all the nodes of the circuit, it determines the relative stress on the circuit elements. Memory usage can be minimized by virtue of the screening procedure as shown in step 103 and the characterization procedure as shown in step 105 as these reduce the number of waveforms that need to be stored. If step 107 stands alone, the process is more flexible as it can be used with the various prior simulators and the other steps can be connected through the interface as described below.

Using a separate simulator for step 107 is less efficient as it requires moving large amounts of data back and forth across the interface. If the simulation can be merged with other steps, it saves on both the time and storage required for this transferal. Embedding into the circuit simulator some, or all, of the functions from the device degradation characterization means (step 105), the device degradation estimation means (step 109), the device degradation quantization means (step 111), and the circuit netlist generation for aging simulation (step 113) will make the hot-carrier circuit simulation much more efficient and capable. This would let the whole flow to be performed as a single run, processing the data along with simulator and not requiring storage of all the other data. This can increase the total speed and capabilities of the flow by orders of magnitude. This embedded process can also combine the parameterized aged device model as described below.

Step 109 is the device degradation estimation means to establish all of the ages for each transistor, or other aged device, specified in the netlist. The device degradation analysis will be more efficient because the relevant storage and computations for the devices pre-specified in step 103 can be skipped. Many devices suffer from multiple aging mechanisms that may have different relative importance depending upon bias conditions or other factors. For devices with multiple hot-carrier degradation taking effect, these devices will have multiple independent device age values each corresponding to one mechanism. These various age values will contribute to the total device degradation.

As already noted, the device degradation estimation means can be embedded into the circuit simulator. This may be implemented in the model evaluation module, but in this case the process depends upon the particular models employed. In one aspect of the present invention, the device degradation estimation means is embedded into the circuit simulator outside of the model part and is consequently independent of the particular models used. This allows newer device models to be incorporated without requiring the device age calculation having to embedded individually for each model.

Some examples of different aging mechanisms are the electron trapping and generation of interface state at the oxide/silicon interface. In addition to trapping electrons, the oxide may also capture holes in traps. Due to their differing charge, trapped holes will react to the resultant electric field at a bias level differently from the electrons: If the drain to gate voltage is positive, $V_{dg}=V_d-V_g>0$, the holes will migrate towards the gate and the electrons towards the drain. Thus, only holes can jump the interface at this bias, while the situation is reversed if $V_{dg}<0$.

At step 111, device degradation can be represented in the new circuit netlist by using the aged device models, by adding current sources, or both. In the first case, the elements and connections in the SPICE (or other simulation) netlist are not actually changed, but the aged model cards used. As the voltage waveforms supplied to different elements are not the same, elements that have the same model card in the fresh simulation will generally have different aged model cards as the parameters will now differ. In the second case, connections of the netlist are changed by introducing current sources between device nodes, with independent current sources accounting for different degradation mechanisms. Examples of models which can be used for these current sources for MOSFETs are the DeltaMOS, DeltaLogId, and DeltaId models described below in the "Modeling and Extraction Methodologies" section.

Adding multiple current sources to represent different degradation mechanisms is shown in FIG. 6 for a MOSFET with multiple sources used simultaneously. In this example, for MOSFET 60 which has multiple hot-carrier degradation mechanisms, each mechanism will have a corresponding device age (as shown in step 109), and consequently, a current source $I_i$ 64-$i$, $1 \leq i \leq n$, will be added in parallel between the source S 62 and drain D 63. In this case, the aged device is represented in the new netlist by the fresh device between the nodes S' 62' and D' 63' and the aging effects separated out in the currents running from between the original source connection S 62 and the node S' 62' to between the original drain connection D 63 and the node D' 63'. Each of the multiple current sources, $$I_i = f_i(V_{ds}, V_{gs}, V_{bs}; P),$$

is added to cover the different mechanisms, where the functional form depends on the mechanism and where P represents the parameter set for the model, such as that described below in the "Modeling and Extraction Methodologies" section. The functional forms of the various $f_i$ will be from physically based models with parameters set by electrical test data.

In some case, a single mechanism may be represented by more than one current source. For example, although the channel in a fresh transistor may be symmetric between the source and drain, due to damage at the silicon-oxide interface this symmetry is lost as the circuit ages. Consequently, the current sources added for the aged device may include separate sources for forward and reverse biased conditions.

The continuous value device degradations can be quantized to build the aged device models, to build current sources, or both, so that rather than doing the simulation for the continuous aging, it can be done in a series of quantized steps. For example, say a circuit has a million transistors that have the same model card when new. As each of these will generally have a different age ranging from zero to a maximum value, the aged device simulation would have a million aged cards in the continuous case. In the quantized case, the age range from zero to the maximum value is broken up into, say, ten sub-ranges with a single age value used for each. Then only the discrete subset of ten model cards is used. The full interval need not be broken up into sub-ranges of uniform size if better resolution is more important in a particular range. The criteria for model quantization can be device age or any device parameters (such as $I_{ds}$ at different bias conditions, device trans-conductance, threshold voltage, etc.) degradations. The device degradation quantization means can be embedded into the circuit simulator. This step is optional.

In step 113 the aging circuit simulation is run with the different elements at their respective different aged models. Each of the simulations of step 113 will generally take significantly less time than the simulation already performed for the fresh device in step 107. This is because in running step 107, the simulation will record the waveforms at the required nodes. These nodes can be specified for particular devices in the screening stage. In step 113, only waveforms at the nodes that are needed for comparison with the fresh waveforms need to be stored. Thus, when doing a simulation for multiple ages in a single run, the ability to share steps 101–107 results in large increase in efficiency even though steps 109–113 must be performed individually for each age.

The above flow is the so-called "one step aging" circuit reliability simulation, where device ages and degradation are estimated using the fresh waveforms generated in step 107. However, as the circuit ages, the waveforms at the devices comprising the circuit will change. Therefore, the accuracy of the circuit reliability simulation should be improved if the circuit waveforms are updated during the degradation circuit simulation. This process will be called "gradual aging".

"Gradual aging" can be realized by adding a loop for steps 107, 109 and 111, as shown by the dotted line in FIG. 5, to update the models of the circuit simulator. Assuming the total circuit stress time is $T_n$, e.g., 10 years, $T_n$ is divided into N time intervals, $[T_0, T_1], [T_1, T_2], \ldots, [T_{n-1}, T_n]$, where $T_0$ is zero. The transient simulation time is T, which is usually much smaller than any above time intervals, for example 10 μs. In "one step aging", the circuit waveform from [0, T] is projected to the end of $T_n$, $$\mathrm{Age}(T_n) = \frac{T_n}{T} \mathrm{Age}(T),$$

or, for the 10 year, 10 microsecond example, $$\mathrm{Age}(10\mathrm{yr}) = \frac{10\mathrm{yr}}{1\mu s} \mathrm{Age}(1\mu s).$$

Instead, for gradual aging the projection will now be made for each time interval.

At the beginning of each time interval, device models will be updated according to device age values. Circuit simulation 107 will be launched using updated device models in each loop, with only the first time interval using the fresh device model. Device age and degradation will then be estimated for each loop in step 109. Device degradation can optionally be quantized and a new circuit netlist for the next time interval will be prepared in step 111. Thus, to make the "gradual aging" more accurate for MOSFET devices, in addition to making $I_{ds} = I_{ds}(t)$, degraded models for $I_{sub}$, $I_{gate}$, and intermediate values can be used for device degradation calculation. For example, in the NMOS hot-carrier aging model example of step 105, age is now a function of $I_{sub}(t)$ and $I_{ds}(t)$:

$$\mathrm{Age}(t) \sum_i \frac{I_{ds}(T_i)}{WH} \left( \frac{I_{sub}(T_i)}{I_{ds}(T_i)} \right)^m \Delta t_i.$$

This loop will continue until the final time interval is completed. While the flow calculated the device age parameters (H, m) using $I_{ds}$, $I_{sub}$, and so on at step 107 for the fresh simulation, the loop back from step 113 uses a differing model at step 107 as $I_{ds}$, $I_{sub}$, and the other parameters will change with time.

Open Data Interface

FIG. 7 is a block diagram of an open data interface (ODI) for use in hot-carrier or other aging simulations. The interface 203 is connected between the degradation simulator 201 and the user inputs 205. In block 205 some of information the user may supply is shown, although not all of these will necessarily be provided in all cases, and in some instance will be integrated into the simulator as described above with respect to step 107 of FIG. 5. This interface 203 places the hot-carrier circuit simulator 201 into the designer's environment, allowing the user to control the calculation of age and other functions by supplying their own, say, age equations and other models into the simulator through 205 to calculate age and degradation equations. This allows the user to customize the simulation to their needs.

Referring to block 205 in more detail, user defined data and models (such as device age 209, device degradation 211 and auxiliary functions 207) that will be used for device age and degradation calculation and user defined circuit simulator can communicate with the hot-carrier circuit simulator through ODI (203). The Circuit Simulator 213 can be of the SPICE or timing simulator type, or the user's adaptation or equivalent. Device instance and model parameters are passed from the hot-carrier circuit simulator 201 through the ODI 203 to user defined data 205. For example, if the channel width W of a MOSFET is needed for the age calculation or the bias conditions are needed for the auxiliary functions, the hot-carrier circuit simulator 201 can provide these values. Similarly, user defined data and the simulation results from the user defined circuit simulator are passed back to hot-carrier circuit simulator 201 through ODI 203.

The user can also supply auxiliary functions to replace or supplement the equations found in the hot-carrier circuit simulator 201. For example, $I_{gate}$ and $I_{sub}$ are sample auxiliary functions. The simulator will provide default equations, but the user may provide auxiliary function that are lacking or for which the user has a proprietary model that they prefer over the default model for their application. For the example of $I_{sub}$, many different model for the substrate current exist and the user may prefer a particular one in their application, such as described in co-pending U.S. patent application Ser. No. 09/661,328, filed on 14 Sep., 2000, entitled "MOSFET Modeling for IC Design Accurate for High Frequencies", which is hereby incorporated herein by this reference. The user can select which function they supply, just specifying a module for, say, $I_{sub}$, and using default modules for others.

Input parameters, intermediate and final results can be shared among all the user defined data, such as passing $I_{sub}$ to $I_g$, as $I_g \propto I_{sub}$. This can also include bias conditions, so that a function, say, age can now be a function of parameters beyond $I_{ds}$, age→age($I_{ds}, V_{ds}, V_{gs}, V_{bs}$), and so on. Multiple user defined data of the same functionality (such as the device age) can be integrated with the other user defined data. The user may have multiple equations of how, say, age model is calculated and may call any of these. Users have the flexibility to choose any one of them. User defined data can also be combined with the internal data in the hot-carrier circuit simulator (201) to fulfill the device age/degradation calculation. Again, these can be data that come with device or add in some proprietary ones the user has added in. The user defined data can be incomplete. For any of the user definable data not defined, internal data will be used. User defined functions can access intermediate results of circuit simulation, such as the saturation voltage, $V_{dsat}$, or threshold voltage, $V_{th}$, and not just $I_{ds}$.

Parameterized Aged Device Model

Another approach that can be used to study circuit degradation is the use of a parameterized device model. This method can be used to replace the above approach through use of a parameterized model card for each of the specified circuit elements, or can be used in a complementary fashion, with some of devices using the parameterized model as described below and the rest of the devices treated as above. Each model parameter can be formulated as a function of several intermediate quantities that measure device degradation, such as device age or other device parameter ($I_{ds}$, $V_{th}$, $G_m$, and so on). We will use device age as an example hereinafter.

Because aged device parameter is a function of device age, device model card can be parameterized with the device age as a parameter. This implies that one model card can be used by devices of different device age values. Age value can be quantized to limit the number of aged device models if a circuit simulator needs to predetermine the models at the start of simulation. One sample model card could be expressed as .model nmos nmos vth0='0.7+5*age', where vth0 is the model parameter related to the threshold value and the other model parameters are suppressed for simplicity. The functional form of the parameters, such as the shown linear relation for the threshold voltage, can either be experimentally determined, or have a functional form based on physical model with the coefficients experimentally determined. The building of age models is described more fully below in the "Modeling and Extraction Methodologies" section.

The circuit simulator can then accept device age as an instance parameter. One example is listed as follows:

m1 1 2 3 4 nmos W=10 u L=0.25 u age=0.01

This age value will be used for calculating aged device model parameters. To obtain the age values for the devices in the netlist, the steps 101–109 in the flow of FIG. 5 can still be performed, but the preparation of the netlist in step 111 is different. The age value can also be specified.

In simulators that do not support age as an instance parameter, a macro or subcircuit can also be used to prepare aged device model parameters from a device age value. An auxiliary program can convert each degradable device to a subcircuit call. The advantage of this approach is that currently available circuit simulators widely support this netlist style even if they do not accept device age directly as an instance parameter. The examples of FIG. 8 shows the entry of MOSFET m1 in a netlist converted to a subcircuit call Xm1 with the device age value of age1. The left and right show two differing results, on the left converting to a subcircuit to introduce the age and on the right to compute a parameter (here vth0 as above) from this value. The value of age1 will be used to prepare the aged device model for m1. The use of subcircuits is described more fully in co-pending U.S. patent application Ser. No. 09/661,328, filed on 14 Sep., 2000, entitled "MOSFET Modeling for IC Design Accurate for High Frequencies", that was incorporated by reference above.

According to another aspect, device age calculation and aged device model parameters can be accomplished inside the model evaluation module for each device. A circuit simulator contains both an engine to solve the circuit and the model evaluation module. Rather than compute an expression such as, say, vth0='0.7+5*age' in the engine, the model evaluation module can alternately calculate vth0=f(age). A model flag can be used to control whether the computation of the device age and the aged device model parameter should be carried out. For example, this can be implemented .model nmos nmos aging_flag=1 where the other parameters are again suppressed. If the flag is set to 1, the aged device model parameter will be calculated based on the parameterized equation. This would occur in the circuit simulation 107 and present a more integrated approach to compute $I_{ds}$ and other output values. If the flag is set to 0, the calculation would not occur, as would be the case in simulating the fresh model or when the user prefers to use the full flow of FIG. 5.

Modeling and Extraction Methodologies

This section concerns the individual devices that compose a circuit. This begins with a modeling procedure for device age or degradation of a MOSFET or other device in a SPICE or other simulator. This is then followed by methods for how the device operates when degraded. These procedures are then used to extend the concept of binning to include degradation. These methods allow a device degradation model developed from any one parameter to be applied to other parameters. Specific relations for a particular embodiment to categorize and incorporate hot carrier degradation are presented.

FIG. 9 is a flow chart for building a device degradation model, for example the device age model of a MOSFET, by calculating the "age" or "model age" of the device. More generally, this process can be based on any intermediate quantity indicative of the level of device degradation and not just "age"; but to simplify the terminology, the discussion below is mostly discussed in terms of the common case of age. At step 901, the devices will be stressed, device parameters will be measured at several time intervals. To be concrete, the discussion will use an exemplary embodiment of a MOSFET using the example of an age relation given above, $$\delta Age(t) = \frac{I_{ds}}{WH}\left(\frac{I_{sub}}{I_{ds}}\right)^m \delta t,$$

where t is the time to stress, H and m are known as the voltage acceleration parameters in the degradation model. The degradation of a parameter P, $\Delta D_P$, is expressed in the relation $$\Delta D_P = (Age_P)^n = (AR)_P^n t^n,$$

where AR is the age rate and P is, for example, current $I_{ds}$, transconductance $G_m$ or other measurable parameters. The power dependence of the degradation, n, is known as the time acceleration parameter and gives the functional relation between time and degradation. The values for H, m and n depends on what is used for the parameter P, so that in general $(H_{P1}, m_{P1}) \neq (H_{P2}, m_{P2})$ and $n_{P1} \neq n_{P2}$, and the conditions under which they are measured. For example, digital designs may be worried about driving capabilities under higher bias and look at $\Delta Ids$ at saturation, while analog engineers may worry more about the linear region and so use a lower Vds value to measure the device parameter degradation.

A definition of lifetime is also needed. For example, using drain current at saturation this could be, say, a 10% degradation:

$$\frac{\Delta I_{ds,sat}}{I_{ds,sat}}\bigg|_{V_{gs}=V_{dd}, V_{ds}=V_{dd}} = -0.1.$$

Thus, if stressed to a −10% degradation under bias condition 1, this would result in a lifetime τ1 under this bias, and a lifetime τ2 under bias 2, and so on. Generally, the higher the bias condition, the shorter the τ value.

At step 903, the user can choose any device parameter (such as Ids under any bias condition), to extract the time acceleration parameter n. Various forms for the functional relation between time and degradation can also be selected, such as fitting the log(log(degradation)) vs. log(time) relation instead of log(degradation)) vs. log(time) can be used for the parameter extraction. This is described more below as the delta log Id model.

In the prior, $I_{ds}$ in the saturation or linear region are often used as the parameter. As noted above, the value of n depends on parameter used. In one aspect of the present invention, the user can select the parameter, such as $$\frac{\Delta V_{th}}{V_{th}}, \frac{\Delta I_{ds,sat}}{I_{ds,sat}}, \frac{\Delta I_{ds,lin}}{I_{ds,lin}}, \Delta V_{th}, \Delta I_{ds,sat}, \Delta I_{ds,lin}$$

and so on to extract n from the ΔD relation. If the functional relation of $\Delta D \cdot t^n$ is selected, then a plot of logΔD versus log t will have a slope n, but in the prior art this acceleration parameter will be associated with the parameter used, for example $n_{Vth}$. In one aspect of the present invention, during the simulation, only a single n corresponding to the selected parameter is extracted. Although this process could be performed for multiple parameters, it has been found that the behavior of a device can be obtained using only the single selected parameter. This can either be chosen for convenience or due to its particular relevance. This allows the extraction to be performed only once and still use the value of n for many different focuses. Thus, although for example $n_{\Delta Vth} \neq n_{\Delta Ids}$ if these were extracted from the parameters indicated by the subscript, the user can use an arbitrary n without loss of accuracy as long as n is from the correct device.

It has also been found that functional forms other than $\Delta D \sim t^n$ for the relation between device degradation and time could yield better results in some circumstances. This can be exploited by allowing the user to select a functional form, ΔD=f(Age,n). In particular, in some cases it is found that log(time) versus log(log(degradation)) is more linear than versus log(degradation)).

At step 905, the voltage acceleration parameters H and m for the MOSFET device degradation or age model will be extracted by considering multiple device degradation mechanisms at different bias conditions which will improve the accuracy of device degradation calculation. For the DeltaMOS and DeltaLogId models discussed below, parameter H can be removed as its function will be merged with some other terms in the models. Additionally, the parameter m can keep a constant value such as 3.0.

If τ is a lifetime for the device, the values of H and m can be extracted from the relations above between δAge and δt as m will be the slope and H the intercept for a plot of log(τ

$I_{ds}$) versus $\log(I_{sub}/I_{ds})$. The value of n will be from the previous step and the process is done for several different bias conditions. As the n values depend on parameter chosen and bias conditions, so then will m and H.

As noted, in the models developed below, the parameter H need not be extracted, but taken as a constant and absorbed into other parameters such as the parameters d1 and d2 in equation (3) below. The parameter m is related to the energy required for a hot carrier to jump into the oxide of the MOSFET. Even if H is not extracted, m can still be extracted and used. Alternately, a value for m can be derived from physical principles.

It has been found that the relation between ΔD and Age is not best represented in many cases by a strict power, but contains different regions that can be represented in this way. A typical relation between $\log(\Delta D)$ and Age is shown in FIG. 10. This figure shows that the curve 1000 starts off with a slope that gradual rolls off into a "degradation saturation" region where it flats out to a more or less constant slope. By using the single acceleration parameter as in the prior art, call it $n_0$, to present device degradation would use the slope of line 1001 to extract its value. The line 1000 is better approximated by using different values of n for linear approximations of different portions. As shown in FIG. 10, a good approximation can generally be obtained by a first acceleration parameter $n_1$ in the initial region that corresponds to the slope of the line 1011 and a second acceleration parameter $n_2$ for the saturation region that corresponds to the slope of the line 1012.

The two regions can be combined in a smooth function that combines the two regions. One example is shown below in equations (3) and (11), which use the form $[(\alpha_1 Age^{n1})^{-S} + (\alpha_2 Age^{n2})^{-S}]^{-1/S}$, where the parameters $\alpha_1$, $\alpha_2$ are $d_1$, $d_2$ in those equations and the smoothing factor S is a positive constant. The value of n is that extracted in step 903 and is used to obtain an Age value in a first approximation, which can then be used to obtain the further values of n such as $n_1$ and $n_2$.

At step 907, the parameters $n_1$ and $n_2$ will be extracted again to consider the degradation saturation effect and which will improve the accuracy. This step is optional since if line 1000 of FIG. 1 is considered linear enough, the initial n value could be used. Alternately, this process could of course be extended to beyond the two segment linear approximation of curve 1000 by further iterations of step 907.

Once the degradation model is obtained from one of the variation of the process of FIG. 9, the model for the degraded device (such as a SPICE type model) can be obtained. Two embodiments are presented in FIGS. 11 and 14.

FIG. 11 is a flow chart of the first embodiment for building degraded device model. At step 1101, the devices will be stressed, and device characteristics and parameters will be measured at several time intervals. This can be performed at the same time as step 901 above, but makes additional measurements. In step 901, points were obtained for parameters at the time values; here, curves such as the I-V characteristics at the time values are also measured as these are used to extract the SPICE or other model. Step 1103 builds the device degradation model from the measured device parameters. This is the flow of FIG. 9 above.

In step 1105, fresh and degraded device models are built from the measured device characteristics and the device degradation level is calculated for each device model. The fresh and degraded models can be built separately. The model cards are extracted from the respective fresh and degraded curves, such as those shown in FIG. 12. FIG. 12 shows $I_{ds}$–$V_{ds}$ curves for different values of the gate voltage $V_{gs}$, where the solid curves represent the fresh device and the broken curves the degraded device. The models for the fresh and degraded devices can be constructed separately. The device age or degradation is calculated for each model, and is a function both of degradation level and bias conditions, such as shown in equations (1) and (11).

At step 1107, analytical functions can be used to build the degraded device model parameters as a function of device age by fitting the aged device model parameter vs. device age curves. Model parameter at any age value can then be calculated from the function. With this analytical function, the device model card can be parameterized, with device age as a parameter in circuit netlist. This allows devices with different age values can share a same device model.

For example, in a model card there will be model parameters $p_i$ with values $V_i$ that change with age. From the relation between Age and $V_i$, a table of $p_i$ at the Age values can be built. This situation is shown in FIG. 13, where a set of model cards are shown for Age values 0, 1, ..., n. Each of the parameters $p_i$ has corresponding values $V_i 0$, $V_i 1$, ..., $V_i n$. Through curve fitting or using known equations, the functional relation $p_i = f_i(Age)$ is then constructed. As degradation affects different parameters to different degrees, the process is generally done only for a relatively small number of sensitive parameters. These can either be pre-selected in the software or user selected.

FIG. 14 is a flow chart of a second embodiment for building degraded device model. Referring to FIG. 14, at step 1401, devices will be stressed, device characteristics and parameters will be measured at several time intervals. At step 1403, build device age model from measured device parameters. These are the same as in steps 1101 and 1103

The second embodiment differs in the next pair of steps. At step 1405, fresh device models are again built from measured device characteristics and device ages are again calculated for the stressed devices. Unlike step 1105, it is only the fresh models, and not the degraded models, that are constructed. The age is calculated from the Age=(AR)t relation.

At step 1407, analytical functions can be used to build the aged device model parameters as a function of device age by fitting the measured device parameters vs. device age values. Device model parameter at any age value can be calculated from the function. With this analytical function, device model card can be parameterized, with device age as a parameter in circuit netlist. This allows devices with different age values can share a same device model.

Step 1407 is similar to step 1107, but differs in several ways. In this case, the result is just the model card for the different ages: that is, rather than have the different values $V_i$ for model parameter $p_i$ at the different ages as shown in FIG. 13, only the value for Age=0. The result of the process is still a functional relation $p_i = f_i(Age)$ for model parameters, but without the table of $p_i$ versus Age. Instead, it is now derived fitting measured device parameters, such as $V_{th}$, $I_{ds,sat}$, and so on. This uses tables of, say, $V_{th}$ versus Age, $I_{ds,sat}$ versus Age, etc. to fit the curves for these device parameters to obtain the functional relation for the selected model parameters $p_i$ through the dependence of the device parameters on the model parameters. Generally, this method will be more computational than that of step 1107.

The techniques of FIGS. 9, 11, and 14 can be combined with the concept of binning to provide a binning model for degraded devices. FIG. 15 is a flow chart of a first embodiment for building a degraded binning model, with a second embodiment given in FIG. 17. The concept of binning is explained with FIG. 16.

A particular device may occur in a circuit a number of different times with different dimensions. For example, there may be many occurrences of an NMOS transistor having different dimensions. Rather than provide model cards for every device, they can be grouped together in "bins". This is shown in FIG. 16 where the range of width and length values for MOSFETs in a circuit are divided up into smaller regions. All of the devices within a region are then given the same model card. For example, all of the devices in region 1601, with lengths between A and B and widths between A and C, are binned together. The grid defining the regions need not have the same number of divisions in the different directions and the size of the divisions need not be uniform, but can be chosen for convenience or to provide higher accuracy in a particular range of values. For example, if the device was relatively immune to length variations, the grid could have fewer divisions in this direction; if the device is more sensitive to changes in length at shorter length, the grid could have finer resolution at short lengths.

To build a model card for a sector, say 1601, the procedure is to go to the four corners, in this case A, B, C, and D, and construct the model cards for these dimensions. The card for the sector bound by these corners is then formed from a composite of these. Similarly, the card for sector 1603 is constructed from devices at the vertices A, B, X, and Y.

In one aspect of the present invention, binning techniques are extended to include degradation. This essentially adds a third dimension of device age or degradation to the usual binning based on width and length found in the prior art for the fresh model. Thus for all of the corners of a sector, the devices with those dimensions could be stressed and the corresponding degraded models build, from which the degraded model for the sector constructed. However, since degradation, and in particular aging due to hot carrier effects, is most pronounced for short channel devices, it is found in most cases that incorporating aging effects only for devices with minimum channel length is sufficiently accurate. The exemplary embodiment will follow this approach, although it readily extends to incorporating degradation effects larger channel lengths if the resultant accuracy is worth the increased computation.

Referring to FIG. 15, at step 1501, only devices with minimum channel length, but not necessary all of them, will be stressed. Devices with other channel lengths are assumed to have insignificant hot-carrier degradations. This is the procedure from steps 901 and 1101 or 1401. Step 1503 builds the device degradation models from the stressed devices with minimum L, as is done in the flow of FIG. 9. At step 1505, the aged device model using FIG. 11 or/and FIG. 14 flows is built. As described above, the result is then $p_i = f_i(Age)$ for the selected parameters $p_i$ for each of the stressed devices. Note that the set of selected parameters need not be the same for all of the different width values at $L_{min}$, although this will generally be the case.

For the example of region 1601 with devices at both of the $L_{min}$ corners stressed, the result will be $p_i^A = f_i^A(Age)$ and $p_i^C = f_i^C(Age)$ for the corners A and C. In the exemplary embodiment, the devices corresponding to corners B and D are not stressed and $p_i^B, p_i^D \neq f(Age)$. From theses, $p_i^{region} = f_i^{region}(Age)$ is constructed in step 1507. If degradation is significant for the channel length corresponding to B and D, the degradation can also be incorporated at the cost of more computation.

Thus, at step 1507, for any stressed devices, it has an analytic function for each aged device model parameters as a function of age value. Unstressed devices $L_{min}$ will be skipped in building the binning model, as described below in the second embodiment discussed with respect to FIG. 17. For all the devices other than the minimum L devices, their aged device models are all the same as their corresponding fresh ones. The binned model parameters will be an analytic function of device age.

FIG. 17 is a flow chart of a second embodiment for building a degraded binning model. At step 1701, only devices with minimum channel length, but not necessary all of them, will be stressed. Devices with other channel lengths are assumed to have insignificant hot-carrier degradations. Their aged device models are all the same as their corresponding fresh ones. At step 1703, device age model is built from the stressed devices with minimum L. These are the same as steps 1501 and 1503 above.

Step 1705 builds degraded device models and calculates degradation level values for aged device models, as in step 1405. Step 1707 obtains a set of device age values from all the aged device models of this device. For example, picking one of the $L_{min}$ corners, the process builds, say, 10 device models for A to get $Age_0, Age_1, \ldots, Age_{10}$ for times $t_0$, $t_1, \ldots, t_{10}$, where $Age_0$ at $t_0$ corresponds to the fresh device.

At step 1709, for any stressed device, a degraded device model of a specific degradation value will be generated by interpolation or extrapolation from the measured values. Consider the case where for point C of FIG. 16 at, say, times $t_0, t_{C1}, t_{C2}, t_{C3}$, there are the ages of $Age_0, Age_{C1}, Age_{C2}, Age_{C3}$. To construct the model card for bin 1601 for times $t_0, t_1, \ldots, t_{10}$, the process will generate the parameters for C at the 10 values corresponding to $t_1, \ldots, t_{10}$.

The 10 (in this example) new degraded model cards at these times for C will be build from the three stressed model at $t_{C1}, t_{C2}, t_{C3}$. For example, if at $Age_1$ the device of point A has $\Delta V_{tH} = 0.1V$, to get the device at point C with a $\Delta V_{th}$ of 0.1V the parameters in the model card are adjusted for C at $Age_{C1} = Age_1$ to get this value. This allows a set of ten degraded model cards for the bin region, here 1601, to be constructed. Hence there will be a binned model for each of the 10 ages and an interpolation can be done for the real Age values.

For those unstressed devices, degraded device models can be generated by adjusting parameters in the fresh models to get the same device parameter degradations as the stressed devices of the same age value. This allows for a missing $L_{min}$ corner to be built. Alternately, these devices can be skipped in building the binning model, so that if, say, the device at A is skipped, the regions 1601 and 1603 could be combined into a single bin using X, Y, C, and D. At step 1711, the age value used in the binning will be the age value for the binned model.

FIGS. 18 and 19 are flow charts for the binning methodology of degraded device models based on FIGS. 15 and 17, respectively. These embodiments treat time in discreet values and describe the use of binning in these two cases. Referring to FIG. 18, step 1801 starts with the degraded binning model of the flow in FIG. 15. The device age value is supplied at 1803, and for this value the effective model parameters are calculated (step 1805) using the model from step 1801.

In the embodiment of FIG. 19, the binning model of FIG. 17 and a device age value are supplied at steps 1901 and 1903, respectively. Using the pair of degraded device models with the age values nearest the supplied age value, effective model parameters are calculated in 1905 using the model of FIG. 17. The model parameters for the supplied age are then interpolated or extrapolated at 1907.

As described above, the present invention allows a degradation value derived from one parameter to be used in obtaining the degradation of another device parameter. For example, the Age value in equation (1) below need not be that obtained through measurements on the drain current and the Age value in equation (11) below need not be that obtained through measurements on the threshold voltage. FIG. 20 is a flow chart for generating degradation on any device parameter.

In step 2001, a degradation level value and degraded device model are obtained using any selected device parameter, such as $I_{ds}$, $V_{th}$, $G_m$, and so on. From this, the degraded device characteristics are generated using the Age value and generating the device characteristics, such as the I-V curves, in step 2003. In step 2005, the degradation of any device parameter can be extracted.

Thus, the method allows use of, say, $\Delta V_{th}$ or $\Delta G_m$ to calculate an acceleration parameter n characterized accordingly. As the value of n differs for different parameters, it will generally be the case that $n_{V_{th}} \neq n_{I_{ds}} \neq n_{G_m} \neq \ldots$, and the practice in the prior art is to use $n_{Vth}$ to generate $\Delta V_{th}$, $n_{Ids}$ to generate $\Delta I_{ds}$, $n_{Gm}$ to generate $\Delta G_m$, and so on. Consequently, if a user wanted both, say, $\Delta V_{th}$ and $\Delta G_m$, two separate calculations would be run. According to the present invention, using only a single parameter, say $n_{Vth}$ can be used not just for $\Delta V_{th}$, but also $\Delta G_m$, $\Delta I_{ds}$, etc. This is done by extracting device parameters from the device behavior, such as the I-V curves, instead of just using the equations of each of the parameters.

DeltaMOS Model and DeltaLogId Model

As described above, a degraded device can be represented either in a SPICE or other simulator, or through representing the degraded device by using a fresh model with elements to incorporate the aging external to the fresh device, such as in FIG. 6. In this latter approach, the fresh device is not aged, although the two approaches can be combined. This is a unified compact scalable DeltaMos model for accurate hot-carrier reliability circuit simulation based on the equations below. This section also expands and enhances this procedure, for example adding external voltage sources as well as current sources.

Strong dependencies on oxide electric field $E_{ox}$ and body bias Vbs should be incorporated into the model for accuracy as shown in Equation (1):

$$\frac{\Delta I_{ds}}{I_{ds0}} = \frac{\Delta I_{ds,l}}{I_{ds,l0}}(V_{gs}, V_{bs}, \text{Age}) * F(V_{gs}, V_{ds}), \quad (1)$$

where $I_{ds,l}$ is the drain-source current in the linear region. As described above, it also improves the smooth transition from subthreshold region to linear region and to saturation region. One form of the implementation can refer to Equation. (2–6). The $E_{ox}$ effect is reflected in the $V_{gsteff}/T_{ox}$ term.

$$F(V_{gs}, V_{ds}) = \frac{1}{1 + \exp\left(\frac{V_{ds} - a_1 * V_{gs} - a_2}{b_1 * V_{gs} + b_2}\right)} + (c_1 * V_{gs} + c_2) \quad (2)$$

$$\frac{\Delta I_{ds,l}}{I_{ds,l0}}(V_{gs}, V_{bs}, \text{Age}) = \quad (3)$$

$$\frac{1}{l_{eff}} * [(d_{1eff}(V_{gs}, V_{bs}) * \text{Age}^{n_1})^{-S} + (d_{2eff}(V_{gs}, V_{bs}) * \text{Age}^{n_2})^{-S}]^{-1/S}$$

This form shows the use of multiple acceleration parameters described with respect to step 907 of FIG. 9.

$$d_{1eff}(V_{gs}, V_{bs}) = \frac{d_{10} * C_f}{1 + (d_{1a} + d_{1c} * V_{bs}) * \frac{V_{gsteff}(V_{gs}, V_{bs})}{T_{ox}} + d_{1b} * \left(\frac{V_{gsteff}(V_{gs}, V_{bs})}{T_{ox}}\right)^2} \quad (4)$$

$$d_{2eff}(V_{gs}, V_{bs}) = \frac{d_{20} * C_f}{1 + (d_{2a} + d_{2c} * V_{bs}) * \frac{V_{gsteff}(V_{gs}, V_{bs})}{T_{ox}} + d_{2b} * \left(\frac{V_{gsteff}(V_{gs}, V_{bs})}{T_{ox}}\right)^2} \quad (5)$$

The asymptote functions can be introduced to better model the coefficients $d_{1eff}$ and $d_{2eff}$, with one form of the implementation in Equations (4), (5), (7), and (8).

$$V_{gsteff}(V_{gs}, V_{bs}) = \quad (6)$$

$$\frac{2 * s_{fl} * V_{tm} * \ln\left[1 + (s_{f0} + d_b * V_{bs}) * \exp\left(\frac{V_{gs} - V_{th0}}{2 * s_{fl} * V_{tm}}\right)\right]}{1 + \left(s_{f0} + d_b * V_{bs} * \exp\left(\frac{V_{th0} - V_{gs}}{2 * s_{fl} * V_{tm}}\right)\right)}$$

where, if $(C_{ft}^2 + 4 * d_a >= 0)$, $$C_f(V_{gs}) = 0.5 * \left(C_{ft}(V_{gs}) - \sqrt{C_{ft}(V_{gs})^2 + 4 * d_a}\right) + 1 \quad (7)$$

else $$C_f = 0$$

and $$C_{ft}(V_{gs}) = 2 * V_{tm} * \ln\left[1 + c_{f0} * \exp\left(\frac{V_{gs} - V_{th} - v_{off}}{c_{fl} * V_{tm}}\right)\right] - 1 \quad (8)$$

Bias dependency of n1 and n2 improves the accuracy. $V_{gs}$ and $V_{ds}$ dependencies can be separated. One form of the implementation is shown in Equations (9) and (10):

$$n_1 = n_{10} \frac{1 - n_{11} * \exp(-n_{1d} * V_{ds})}{1 + n_{1g} * V_{gsteff}} \quad (9)$$

$$n_2 = n_{20} \frac{1 - n_{21} * \exp(-n_{2d} * V_{ds})}{1 + n_{2g} * V_{gsteff}} \quad (10)$$

The use of $(d_1, n_1)$ and $(d_2, n_2)$ let the single Age be used regardless of the parameter from which it was obtained.

Threshold voltage degradation can be included. One form of the implementation is shown in Equations (11–18), which are similar to the $I_d$ degradation equations as shown in Equations (3–10). Below, $\Delta V_{th}=V_{th}-V_{th0}$ where $V_{th}$ is the degraded threshold voltage and $V_{th0}$ is the fresh threshold voltage.

$$\frac{\Delta V_{th}}{V_{th0}}(V_{gs}, V_{bs}, \text{Age}) = \tag{11}$$

$$\frac{1}{l_{\text{eff}}} * \left[(d_{3\text{eff}}(V_{gs}, V_{bs}) * \text{Age}^{n3})^{-S1} + (d_{4\text{eff}}(V_{gs}, V_{bs}) * \text{Age}^{n4})^{-S1}\right]^{-1/S1}$$

$$d_{3\text{eff}}(V_{gs}, V_{bs}) = \frac{d_{30} * C_{f1}}{1 + (d_{3a} + d_{3c} * V_{bs}) * \frac{V_{gsteff1}(V_{gs}, V_{bs})}{T_{ox}} + d_{3b} * \left(\frac{V_{gsteff1}(V_{gs}, V_{bs})}{T_{ox}}\right)^2} \tag{12}$$

$$d_{4\text{eff}}(V_{gs}, V_{bs}) = \frac{d_{40} * C_{f1}}{1 + (d_{4a} + d_{4c} * V_{bs}) * \frac{V_{gsteff1}(V_{gs}, V_{bs})}{T_{ox}} + d_{4b} * \left(\frac{V_{gsteff1}(V_{gs}, V_{bs})}{T_{ox}}\right)^2} \tag{13}$$

$$V_{gsteff1}(V_{gs}, V_{bs}) = \tag{14}$$

$$\frac{2 * s_{f3} * V_{tm} * \ln\left[1 + (s_{f2} + d_{b1} * V_{bs}) * \exp\left(\frac{V_{gs} - V_{th0}}{2 * s_{f3} * V_{tm}}\right)\right]}{1 + (s_{f2} + d_{b1} * V_{bs}) * \exp\left(\frac{V_{th0} - V_{gs}}{2 * s_{f3} * V_{tm}}\right)}$$

where, if $(C_{f1}^2 + 4 * da1 >= 0)$ $$C_{f1}(V_{gs}) = 0.5 * \left(C_{f1}(V_{gs}) - \sqrt{C_{f1}(Vgs)^2 + 4 * d_{a1}}\right) + 1 \tag{15}$$

else $$C_{f1} = 0$$

$$C_{f1}(V_{gs}) = 2 * V_{tm} * \ln\left[1 + c_{f2} * \exp\left(\frac{V_{gs} - V_{th0} - v_{off1}}{c_{f3} * V_{tm}}\right)\right] - 1 \tag{16}$$

$$n_3 = n_{30} \frac{1 - n_{31} * \exp(-n_{3d} * V_{ds})}{1 + n_{3g} * V_{gsteff1}} \tag{17}$$

$$n_4 = n_{40} \frac{1 - n_{41} * \exp(-n_{4d} * V_{ds})}{1 + n_{4g} * V_{gsteff1}} \tag{18}$$

In these equations, $V_{tm}$ is the thermal voltage (Kt/q) and the following are all model parameters:

$a_1, a_2, b_1, b_2, c_1, c_2, n_{10}, n_{11}, n_{1g}, n_{1d}, n_{20}, n_{21}, n_{2g}, n_{2d}, s, d_{10}, d_{1a}, d_{1b}, d_{1c},$ $d_{20}, d_{2a}, d_{2b}, d_{2c}, s_{f0}, s_{f1}, c_{f0}, c_{f1}, V_{off}, d_a, d_b; n_{30}, n_{31}, n_{13g}, n_{3d}, n_{40}, n_{41}, n_{4g},$ n4d, s1, $d_{30}, d_{3a}, d_{3b}, d_{3c}, d_{40}, d_{4a}, d_{4b}, d_{4c}, s_{f2}, s_{f3}, c_{f02}, c_{f3}, v_{off1}, d_{a1}, d_{b1}$ The $I_{ds}$ degradation can be incorporated into aging circuit simulation by adding a current source in parallel to the MOSFET channel for each $I_{ds}$ degradation component of the device as described with respect to FIG. 6 above. The value $I_d$ is as seen from external to the circuit, $I_{ds0}$ is the fresh device value, and $\Delta I_{ds}=I_{ds}-I_{ds0}$. The $V_{th}$ equations can be similarly incorporated.

Before, a fresh model card was used with a current source with magnitude $\Delta I_{ds}$ connected between the source and drain terminals. The model card can also be changed to include Vth degradation by incorporating, either instead or additionally, a voltage source with magnitude $\Delta V$ connected to a terminal of the fresh device. FIG. 21 shows an exemplary embodiment. Also, it should be noted that if $V_{th}$ changes, so will other parameters, such as intrinsic capacitor parameters and so on.

FIG. 21 shows a MOSFET 2000 which has a voltage source $\Delta V_{th}$ 2004 added between the gate and the gate terminal G 2001. The aged device is represented in the netlist by the fresh device (between the nodes G' 2001', S' 2002' and D' 2003') and the aging effects separated out in the voltage source 2004 between the original gate connection G 2001 and the node G' 2001'. The original source and drain are unchanged in this example, so that S, D and the same as S', D'.

Thus, the $V_{th}$ degradation can also be considered into aging circuit simulation by adding a voltage source at one device terminal or by modifying the threshold voltage parameters in the model cards. This will help to improve the model accuracy as it also considers other device degradations such as the intrinsic capacitance degradation, in addition to the Id degradation. One or more such voltage sources can be combined with the current sources of FIG. 6. In particular, it is often the case that the one or more of the current sources is a function of the threshold voltage, $I_i=f_i(V_{th})$. This $V_{th}$ can be separated out by placing a voltage source as in FIG. 21 in combination with the current source as in FIG. 6 which is no longer dependent on the threshold voltage, $I_i \neq f_i(V_{th})$.

As noted in the discussion of step 903 of FIG. 9, different functional forms may be selected. One example is the DeltaLogId Model using $\text{Log}(I_{ds}/I_{ds0})$, instead of $\Delta I_{ds}/I_{ds0}$ to formulate hot-carrier degradation in MOSFET transistors. As before, $\Delta I_{ds}=I_{ds}-I_{ds0}$, where $I_{ds0}$ and $I_{ds}$ are fresh and degraded drain current, respectively. All the model equations are the same as that of DeltaMos model, except all the $I_{ds}/I_{ds0}$ terms are changed to $\text{Log}(I_{ds}/I_{ds0})$. Of course, all the model parameters are different. This approach is called the DeltaLogId model.

$\Delta I_{ds}$ can be deduced from $\text{Log}(I_{ds}/I_{ds0})$ equation $[\Delta I_{ds}=(\exp(\log(I_{ds}/I_{ds0}))-1)*I_{ds0}]$ and can be used to add current source for the aging circuit simulation which is similar to the DeltaMos model. Threshold voltage degradation can also be included for the DeltaLogId model which is similar to the DeltaMOS model. Using $\text{Log}(I_{ds}/I_{ds0})$ for building device age model has been shown in step 903 of FIG. 9.

Hot-Carrier Reliability Design Rule Checker

The discussion above presents techniques for simulating the effects of hot-carriers on a circuit and its elements. The result of such a simulation reports out the effects on all of the specified circuit elements, whether or not their levels of degradation exceeds a set of design rules must then be checked by the user afterwards. The result can be a large amount of data that needs to be checked through. The aspects of the invention presented in this section allow the user to specify a set of design rules at the outset and have them checked as part of simulation process. This allows the violated rules to be isolated and distinguished in the output report.

In this way, the design rule checker reports not only the degradation data, but any specified performance rule violations. These rules can be user specified in terms of different mechanisms and different criteria. For instance, a user could specify rules for allowable amount of degradation in $V_{th}$ for a set of NMOS devices, in $I_{ds}$ for a particular PMOS device, both for a subcircuit, and so on. Additionally, a set of default rules can be incorporated.

In an exemplary embodiment, the user provides a netlist for the simulation, but with hot-carrier design rule check (HC-DRC) criteria included. The hot-carrier simulation is then performed as described above. Based on the result, the specified design rule violations, along with any default rule violations, are then reported out. This process will be described with respect to FIG. 22 that shows a flow chart for a hot-carrier reliability design rule checker embodiment.

Referring to FIG. 22, at step 2201, parasitic elements such as resistance, capacitance and inductance can be extracted from the layout to accurately simulate hot carrier effect due to voltage overshoot or undershoot which is enhanced by the parasitic elements. Similarly, this also allows IR drop in the power net and ground net bounce to be incorporated, as well as cross-talk couplings between elements not coupled on the schematic level. This can be applied at the design stage from the layout window.

Step 2201 is for the interconnects between the elements and has been previously ignored in treatments of hot-carrier effects. An example is shown in FIGS. 23a and 23b. Before, if one device 2301 ended at a node A that is then attached through an interconnect 2310 to device 2303 beginning at B, the nodes A and B in FIG. 23a would just be considered the same node and specified as such in the netlist. In this step, the nodes are no longer considered the same. The parasitic effects, such as the resistance 2311 and capacitance 2313 in FIG. 23b, are now included as these elements affect the voltage levels on nodes A and B and consequently may be important for hot-carrier effects.

Similarly, although a node may be connected to $V_{dd}$ through the power net or ground through the ground net on the schematic level, in practice the actual values will fluctuate. For example, when current flows from one device to the ground net, it can affect the level of other devices so connected as this current can locally alter the voltage level on the ground network. For devices connected to the power net, IR drops will similarly result in deviations from $V_{dd}$. The parasitic elements in the power and ground nets will frequently be greater that those in the device to device interconnects due to the greater lengths and current levels involved. In addition, when treated on the layout level, cross-talk between elements not connected on the schematic can result. These additional parasitic can be extracted and incorporated in the same manner as those shown in FIG. 23.

At step 2203, different circuit blocks or devices from the layout or schematic window can be assigned with different HC-DRC (hot-carrier design rule check) criteria to meet the designer's requirements. HC-DRC criterion can be any device parameters, such as the threshold voltage $V_{th}$ and the drain current $I_{ds}$ for MOSFET transistors. HC-DRC criteria with the same device parameter name but different values will be considered as different criteria. Device type (such as PMOS and NMOS for MOSFET transistors), device model card name, device instance geometry and temperature can also be included in the hot-carrier design rule check criteria. "No checking" is a special criterion that can be specified to skip the HC-DRC checking. Logical expressions and relational operations can be applied to multiple HC-DRC criteria. The value of a HC-DRC criterion can be a relative or absolute value change, for example:

HC_VTH=0.05, HC_MODEL=nmos1 && HC_LENGTH<=0.25 u && HC_TEMP=25 && HC_ID=−10%,

HC_DEVICE=NPN && HC_NOCHECKING,

HC_MODEL=nmos1 && HC_LENGTH<=0.35u && HC_ID_FIXED=−1%, where HC_VTH, HC_ID, HC_ID_FIXED, HC_AGE_FIXED, HC_LENGTH, HC_TEMP, HC_MODEL and HC_DEVICE are sample property names, nmos1 is a model card name, NPN is for npn device. HC_NOCHECKING will skip the HC-DRC. HC_ID_FIXED and HC_AGE_FIXED assign allow values to be assigned, thus skipping the calculations, for Ids degradation and device age value, respectively, before the circuit reliability simulation started. They act as the screening procedure which is optional.

The design rule checker criteria can be set at either the schematic window level or on the layout level. Setting the hot-carrier design rule check criterion in the schematic window can include the following steps:

Attach the HC-DRC criteria to the design library and sub-circuit (or cell) as the properties, where each property can have a default value;

Each device instance can have its own HC-DRC property value that can overwrite the values from the library or from its master sub-circuit;

Netlister, which translates the schematic into circuit netlist file, will interpret the properties and generate the netlist file with statements representing the HC-DRC criteria defined in the schematic properties.

For actually constructing the circuit, the schematic is translated into the layout. The layout is closer to the actual measured values of the circuit since the schematic is more abstract and will lack many of the interconnections of the physical circuit. On the schematic level, step 2201 is not needed.

The following steps set the HC-DRC criterion in the layout window:

The HC-DRC criteria can be applied to devices in one or more areas in the layout in any of the following ways:

a) Use one dummy layer for all HC-DRC criteria. A label or text will be attached to each area in the layer to represent different HC-DRC criteria and their values; alternatively, the property of a geometry drawn with the dummy layer may be used to specify HC-DRC criteria and their values.

b) Use one dummy layer for each HC-DRC criterion, different dummy layers represent different HC-DRC criteria.

c) Use one data type (up to 8 in an exemplary embodiment) in a dummy layer for each HC-DRC criterion, different data types represent different HC-DRC criteria.

d) Use the combination of the above three items.

If two or more areas overlap, the top priority criterion or all the criteria apply.

Layout extraction tool will interpret the relevant dummy layer information and generate the netlist file with statements representing the HC-DRC criteria defined in the layout window.

Some example of netlist statements that include hot-carrier design rule check criteria. In a first format, each instance has its own criterion:

m1 n1 n2 n3 n4 nmos1 w=6 u l=0.25 u $$HC_VTH=0.05
m2 n5 n6 n7 n8 pmos1 w=10 u l=0.25 u $$HC_NOCHECKING
X1 in+ in− out amp $$HC_VTH=0.05 $$HC_ID=−10%

In this example, the first transistor would be reported if it violated the rule by having its threshold voltage exceed 0.05 volts. The second, PMOS transistor will not be checked. In this way, any such calculations related to this element can be skipped if it is know that a particular elements is not a problem. The last line specifies an absolute rule for the threshold voltage and a relative rule for the drain current for all of the transistors in the subcircuit. This pair of rules could also be connected with logical operations.

In a second example, a group of instances share one criterion:

$$HC_MODEL=nmos1 && $$HC_VTH=0.05
m1 n1 n2 n3 n4 nmos1 w=6 u l=0.25 u
m10 n11 n12 n13 n14 nmos2 w=6 u l=0.25 u
$$HC_DEVICE=PMOS && $$HC_ID=-10%
m2 n5 n6 n7 n8 pmos1 w=10 u l=0.25 u
m20 n25 n26 n27 n28 pmos2 w=10 u l=0.25 u
$$HC_ID_FIXED=-10%)
X1 in+ in− out amp Here, the first line specifies a rule for all instances of the model "nmos1", namely a threshold voltage of 0.05 volts. It is then applied to the device of the second line, but not that of the third as it is "nmos2". If there were another instance of "nmos1", it would also apply there. The fourth line specifies a rule of a relative degradation of 10% for all PMOS devices; consequently, it will apply to both "pmos1" and "pmos2" in the following two lines. Finally, the last two lines specify a fixed level of degradation for $I_{ds}$ for the subcircuit X1.

Step 2205 performs the hot carrier circuit simulation as described above using the netlist specifying the design rules. At step 2207, the reliability design rule violations will be checked and be reported.

At step 2209, layout node names will be different from schematic node names after extraction. This is a result of the extraction process described in step 2201 and with respect to FIGS. 23*a* and 23*b*. A mapping technology between the layout and the schematic, such as LVS can be performed to match the layout name to the schematic name. This step is optional if step 2207 is enough for the user's needs.

At step 2211, hot carrier reliability simulation results can be back-annotated to either schematic or layout window to help circuit designers to pin-point design rule violations. In this way, the results of 2207 are taken back and matched to the new schematic. This step is also optional if step 2207 is enough for the user's needs.

Application Domains

It is well known in the art that logic or digital systems and/or methods can include a wide variety of different components and different functions in a modular fashion. The following will be apparent to those of skill in the art from the teachings provided herein. Different embodiments of the present invention can include different combinations of elements and/or functions. Different embodiments of the present invention can include actions or steps performed in a different order than described in any specific example herein. Different embodiments of the present invention can include groupings of parts or components into larger parts or components different than described in any specific example herein. For purposes of clarity, the invention is described in terms of systems that include many different innovative components and innovative combinations of innovative components and known components. No inference should be taken to limit the invention to combinations containing all of the innovative components listed in any illustrative embodiment in this specification. The functional aspects of the invention, as will be understood from the teachings herein, may be implemented or accomplished using any appropriate implementation environment or programming language, such as C++, COBOL, Pascal, Java, Java-script, etc. All publications, patents, and patent applications cited herein are hereby incorporated by reference in their entirety for all purposes.

The present invention is presented largely in terms of procedures, steps, logic blocks, processing, and other symbolic representations that resemble data processing devices. These process descriptions and representations are the means used by those experienced or skilled in the art to most effectively convey the substance of their work to others skilled in the art. The method along with the system to be described in detail below is a self-consistent sequence of processes or steps leading to a desired result. These steps or processes are those requiring physical manipulations of physical quantities. Usually, though not necessarily, these quantities may take the form of electrical signals capable of being stored, transferred, combined, compared, displayed and otherwise manipulated in a computer system or electronic computing devices. It proves convenient at times, principally for reasons of common usage, to refer to these signals as bits, values, elements, symbols, operations, messages, terms, numbers, or the like. It should be borne in mind that all of these similar terms are to be associated with the appropriate physical quantities and are merely convenient labels applied to these quantities. Unless specifically stated otherwise as apparent from the following description, it is appreciated that throughout the present invention, discussions utilizing terms such as processing or computing or verifying or displaying or the like, refer to the actions and processes of a computing device that manipulates and transforms data represented as physical quantities within the device's registers and memories into analog output signals via resident transducers.

Many aspects of the methods of the present invention will most commonly be implemented in software as a computer program product, although many of these can be implemented in hardware or by a combination of software and hardware. As will be understood in the art, the invention or components thereof may be embodied in a fixed media program component containing logic instructions and/or data that when loaded into an appropriately configured computing device cause that device to perform according to the invention. As will be understood in the art, a fixed media program may be delivered to a user on a fixed media for loading in a users computer or a fixed media program can reside on a remote server that a user accesses through a communication medium in order to download a program component. Examples of such fixed media include a disk-type optical or magnetic media, magnetic tape, solid state memory, etc. The invention may be embodied in whole or in part as software recorded on this fixed media.

The invention also may be embodied in whole or in part within the circuitry of an application specific integrated circuit (ASIC) or a programmable logic device (PLD). In such a case, the invention may be embodied in a computer understandable descriptor language which may be used to create an ASIC or PLD that operates as herein described.

Although the various aspects of the present invention have been described with respect to specific exemplary embodiments, it will be understood that the invention is entitled to protection within the full scope of the appended claims.

The invention claimed is:

1. A method of simulating a circuit, comprising:
   providing a netlist specifying the components of the circuit, the netlist including one or more degradation design rules; and simulating the behavior of the circuit using the netlist to determine the degradation of the circuit, wherein the simulating includes determining whether the degradation of the circuit violates the one or more degradation design rules.

2. The method of claim 1, wherein the degradation design rules are specified at the schematic level.

3. The method of claim 1, wherein the degradation design rules are specified at the layout level.

4. The method of claim 1, wherein the components include a MOSFET transistor and wherein the degradation design rules include the degradation level of a device parameter of the MOSFET transistor.

5. The method of claim 4, wherein the device parameter is the drain current.

6. The method of claim 4, wherein the device parameter is the threshold voltage.

7. The method of claim 1, wherein the degradation design rules include devices specified in terms of device type.

8. The method of claim 7, wherein the device type is a PMOS.

9. The method of claim 7, wherein the device type is a NMOS.

10. The method of claim 1, wherein the degradation design rules include devices specified in terms of model card name.

11. The method of claim 1, wherein the degradation design rules include devices specified in terms of device instance geometry.

12. The method of claim 1, wherein the degradation design rules include rules expressed in terms of device temperature.

13. The method of claim 1, wherein the degradation design rules include logical relationships for a plurality of rules for a single device.

14. The method of claim 1, wherein the degradation design rules include a relational operation on a plurality of rules for a single device.

15. The method of claim 1, wherein the degradation design rules include rules expressed in terms of absolute degradation.

16. The method of claim 1, wherein the degradation design rules include rules expressed in terms of relative degradation.

17. The method of claim 1, wherein the degradation design rules include rules assigning degradation levels for specified devices.

18. The method of claim 1, further comprising:
extracting one or more parasitic elements from the circuit, wherein simulating the behavior of the circuit is performed incorporating the extracted parasitic elements.

19. The method of claim 18, wherein the extracted parasitic elements include the parasitics of the interconnects between components whose connections are specified in the netlist.

20. The method of claim 18, wherein the extracted parasitic elements include the parasitics of the interconnects between components whose connections are not specified in the netlist.

21. The method of claim 18, wherein the extracted parasitic elements include the parasitics of the interconnects between components and the power net of the circuit.

22. The method of claim 18, wherein the parasitics of the interconnects between components and the power net of the circuit include resistive, capacitive, and inductive elements, and wherein the simulating includes incorporating voltage drops at the terminals of one or more of the components due to said resistances.

23. The method of claim 18, wherein the extracted parasitic elements include the parasitics of the interconnects between components and the ground net of the circuit.

24. The method of claim 18, further comprising:
revising the provided netlist to include the extracted parasitic elements; and
expressing the determined design rule violations in terms of the revised netlist.

25. A computer readable storage device embodying a program of instructions executable by a computer to perform a method of simulating a circuit, comprising:
providing a netlist specifying the components of the circuit, the netlist including one or more degradation design rules; and
simulating behavior of the circuit using the netlist to determine the degradation of the circuit, wherein the simulating includes determining whether the degradation of the circuit violates the one or more degradation design rules.

26. A method for transmitting a program of instructions executable by a computer to perform a process of simulating degradation of a circuit, said method comprising:
causing the transmission to a client device a program of instructions, thereby enabling the client device to perform, by means of such program, a process of simulating a circuit, comprising:
providing a netlist specifying components of the circuit, the netlist including one or more degradation design rules; and
simulating the behavior of the circuit using the netlist to determine the degradation of the circuit, wherein the simulating includes determining whether the degradation of the circuit violates the one or more degradation design rules.

27. The method of claim 1, wherein one or more of said degradation design rules are specified for analog properties of a device parameter.

28. The method of claim 1, wherein said one or more of said degradation design rules are selected from a plurality of different mechanisms.

29. The method of claim 1, wherein said one or more of said degradation design rules are selected from a plurality of different criteria.

30. The computer readable storage device of claim 25, wherein the degradation design rules are specified at a schematic level.

31. The computer readable storage device of claim 25, wherein the degradation design rules are specified at a layout level.

32. The computer readable storage device of claim 25, wherein the components include a MOSFET transistor and wherein the degradation design rules include the degradation level of a device parameter of the MOSFET transistor.

33. The computer readable storage device of claim 25, wherein the degradation design rules include devices specified in terms of device type.

34. The computer readable storage device of claim 25, wherein the degradation design rules include devices specified in terms of model card name.

35. The computer readable storage device of claim 25, wherein the degradation design rules include devices specified in terms of device instance geometry.

36. The computer readable storage device of claim 25, wherein the degradation design rules include rules expressed in terms of device temperature.

37. The computer readable storage device of claim 25, wherein the degradation design rules include logical relationships for a plurality of rules for a single device.

38. The computer readable storage device of claim 25, wherein the degradation design rules include a relational operation on a plurality of rules for a single device.

39. The computer readable storage device of claim 25, wherein the degradation design rules include rules expressed in terms of absolute degradation.

40. The computer readable storage device of claim 25, wherein the degradation design rules include rules expressed in terms of relative degradation.

41. The method of claim 25, wherein the degradation design rules include rules assigning degradation levels for specified devices.

42. The computer readable storage device of claim 25, further comprising:
 extracting one or more parasitic elements from the circuit, wherein simulating the behavior of the circuit is performed incorporating the extracted parasitic elements.

43. The computer readable storage device of claim 42, wherein the extracted parasitic elements include the parasitics of the interconnects between components whose connections are specified in the netlist.

44. The computer readable storage device of claim 42, wherein the extracted parasitic elements include the parasitics of the interconnects between components whose connections are not specified in the netlist.

45. The computer readable storage device of claim 42, wherein the extracted parasitic elements include the parasitics of the interconnects between components and the power net of the circuit.

46. The method of computer readable storage device 42, wherein the parasitics of the interconnects between components and the power net of the circuit include resistive, capacitive, and inductive elements, and wherein the simulating includes incorporating voltage drops at the terminals of one or more of the components due to said resistances.

47. The method of computer readable storage device 42, wherein the extracted parasitic elements include the parasitics of the interconnects between components and the ground net of the circuit.

48. The method of computer readable storage device 42, further comprising:
 revising the provided netlist to include the extracted parasitic elements; and
 expressing the determined design rule violations in terms of the revised netlist.

49. The computer readable storage device of claim 25, wherein one or more of said degradation design rules are specified for analog properties of a device parameter.

50. The computer readable storage device of claim 25, wherein said one or more of said degradation design rules are selected from a plurality of different mechanisms.

51. The computer readable storage device of claim 25, wherein said one or more of said degradation design rules are selected from a plurality of different criteria.

52. The method of claim 26, wherein the degradation design rules are specified at the schematic level.

53. The method of claim 26, wherein the degradation design rules are specified at the layout level.

54. The method of claim 26, wherein the components include a MOSFET transistor and wherein the degradation design rules include the degradation level of a device parameter of the MOSFET transistor.

55. The method of claim 26, wherein the degradation design rules include devices specified in terms of device type.

56. The method of claim 26, wherein the degradation design rules include devices specified in terms of model card name.

57. The method of claim 26, wherein the degradation design rules include devices specified in terms of device instance geometry.

58. The method of claim 26, wherein the degradation design rules include rules expressed in terms of device temperature.

59. The method of claim 26, wherein the degradation design rules include logical relationships for a plurality of rules for a single device.

60. The method of claim 26, wherein the degradation design rules include a relational operation on a plurality of rules for a single device.

61. The method of claim 26, wherein the degradation design rules include rules expressed in terms of absolute degradation.

62. The method of claim 26, wherein the degradation design rules include rules expressed in terms of relative degradation.

63. The method of claim 26, wherein the degradation design rules include rules assigning degradation levels for specified devices.

64. The method of claim 26, further comprising:
 extracting one or more parasitic elements from the circuit, wherein simulating the behavior of the circuit is performed incorporating the extracted parasitic elements.

65. The method of claim 64, wherein the extracted parasitic elements include the parasitics of the interconnects between components whose connections are specified in the netlist.

66. The method of claim 64, wherein the extracted parasitic elements include the parasitics of the interconnects between components whose connections are not specified in the netlist.

67. The method of claim 64, wherein the extracted parasitic elements include the parasitics of the interconnects between components and the power net of the circuit.

68. The method of claim 64, wherein the parasitics of the interconnects between components and the power net of the circuit include resistive, capacitive, and inductive elements, and wherein the simulating includes incorporating voltage drops at the terminals of one or more of the components due to said resistances.

69. The method of claim 64, wherein the extracted parasitic elements include the parasitics of the interconnects between components and the ground net of the circuit.

70. The method of claim 64, further comprising:
 revising the provided netlist to include the extracted parasitic elements; and
 expressing the determined design rule violations in terms of the revised netlist.

71. The method of claim 26, wherein one or more of said degradation design rules are specified for analog properties of a device parameter.

72. The method of claim 26, wherein said one or more of said degradation design rules are selected from a plurality of different mechanisms.

73. The method of claim 26, wherein said one or more of said degradation design rules are selected from a plurality of different criteria.

* * * * *